(12) United States Patent
Tezuka et al.

(10) Patent No.: US 10,312,239 B2
(45) Date of Patent: *Jun. 4, 2019

(54) SEMICONDUCTOR MEMORY INCLUDING SEMICONDUCTOR OXIE

(71) Applicant: Toshiba Memory Corporation, Minato-ku (JP)

(72) Inventors: Tsutomu Tezuka, Yokohama (JP); Fumitaka Arai, Yokkaichi (JP); Keiji Ikeda, Kawasaki (JP); Tomomasa Ueda, Yokohama (JP); Nobuyoshi Saito, Tokyo (JP); Chika Tanaka, Fujisawa (JP); Kentaro Miura, Kawasaki (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/704,643

(22) Filed: Sep. 14, 2017

(65) Prior Publication Data

US 2018/0269210 A1 Sep. 20, 2018

(30) Foreign Application Priority Data

Mar. 16, 2017 (JP) .................................. 2017-051456

(51) Int. Cl.
*G11C 11/56* (2006.01)
*G11C 16/10* (2006.01)
(Continued)

(52) U.S. Cl.
CPC .... *H01L 27/10802* (2013.01); *G11C 11/5628* (2013.01); *G11C 11/5642* (2013.01);
(Continued)

(58) Field of Classification Search
None
See application file for complete search history.

(56) References Cited

U.S. PATENT DOCUMENTS 8,866,139 B2  10/2014  Ino
9,698,272 B1   7/2017  Ikeda et al.
(Continued)

FOREIGN PATENT DOCUMENTS

JP  2001-527297 A  12/2001
JP  2007-073969 A   3/2007
(Continued)

OTHER PUBLICATIONS

Machine language translation of KR 10-2011-0064551.*
(Continued)

*Primary Examiner* — Erik Kielin
(74) *Attorney, Agent, or Firm* — Oblon, McClelland, Maier & Neustadt, L.L.P.

(57) ABSTRACT

According to one embodiment, a memory includes: a bit line; a source line; a pillar extending in a first direction and including an oxide semiconductor layer; first, second and third layers arranged along the first direction and opposed to a side of the pillar; a memory cell at an intersection between the first layer and the pillar, the memory cell including a charge storage layer in the oxide semiconductor layer; a first transistor at an intersection between the second layer and the pillar; and a second transistor at an intersection between the third layer and the pillar. A first end of the oxide semiconductor layer in the first direction is in contact with the source line, and a second end of the oxide semiconductor layer in the first direction is electrically disconnected from the bit line.

9 Claims, 27 Drawing Sheets

(51) Int. Cl.
- *G11C 16/26* (2006.01)
- *H01L 27/12* (2006.01)
- *H01L 27/108* (2006.01)
- *H01L 29/786* (2006.01)
- *H01L 27/1156* (2017.01)
- *H01L 27/1157* (2017.01)
- *H01L 27/11573* (2017.01)
- *H01L 27/11582* (2017.01)

(52) U.S. Cl.
CPC .............. *G11C 16/10* (2013.01); *G11C 16/26* (2013.01); *H01L 27/10847* (2013.01); *H01L 27/10897* (2013.01); *H01L 27/1156* (2013.01); *H01L 27/1157* (2013.01); *H01L 27/11573* (2013.01); *H01L 27/11582* (2013.01); *H01L 27/124* (2013.01); *H01L 27/1225* (2013.01); *H01L 29/7869* (2013.01); *H01L 29/78648* (2013.01); *H01L 29/78696* (2013.01)

(56) References Cited

U.S. PATENT DOCUMENTS

| | | | | |
|---|---|---|---|---|
| 9,806,085 | B1* | 10/2017 | Wang | .................. H01L 29/4958 |
| 10,043,808 | B1* | 8/2018 | Tezuka | ................ H01L 27/1052 |
| 2007/0064468 | A1 | 3/2007 | Seol et al. | |
| 2011/0280061 | A1 | 11/2011 | Saito et al. | |
| 2013/0228839 | A1 | 9/2013 | Arai | |
| 2013/0285051 | A1 | 10/2013 | Tanaka | |
| 2016/0149004 | A1* | 5/2016 | Rabkin | ............. H01L 21/28282 257/43 |

FOREIGN PATENT DOCUMENTS

| | | | |
|---|---|---|---|
| JP | 2011-258303 | A | 12/2011 |
| JP | 2013-214729 | A | 10/2013 |
| JP | 2013-251533 | A | 12/2013 |
| JP | 2015-128192 | A | 7/2015 |
| JP | 2017-168623 | A | 9/2017 |
| KR | 10-2011-0064551 | * | 6/2011 |
| WO | WO 99/33120 | A1 | 7/1999 |

OTHER PUBLICATIONS

Yoshimitsu Yamauchi, et al, "Study of Novel Floating-Gate Oxide Semiconductor Memory Using Indium-Gallium-Zinc Oxide for Low-Power System-on-Panel Applications", Japanese Journal of Applied Physics, vol. 52, No. 9R, 2013, 9 Pages.

T. Matsuzaki, et al., "Multilevel Cell Nonvolatile Memory with Field-effect Transistor Using Crystalline Oxide Semiconductor", ECS Transactions, vol. 64, (14), 2014, pp. 101-111.

H. Inoue, et al., "Nonvolatile Memory With Extremely Low-Leakage Indium-Gallium-Zinc-Oxide Thin-Film Transistor", IEEE Journal of Solid-State Circuits, vol. 47, No. 9, 2012, pp. 2258-2265.

* cited by examiner

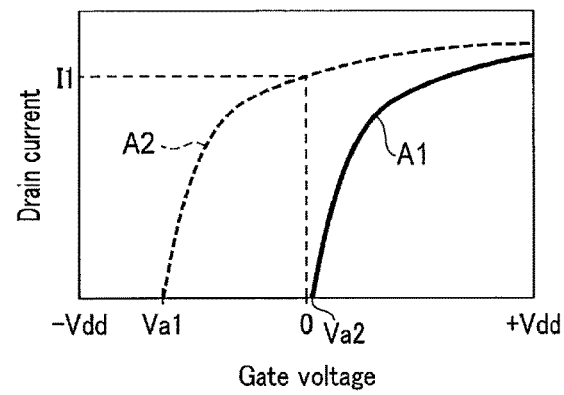
F I G. 5
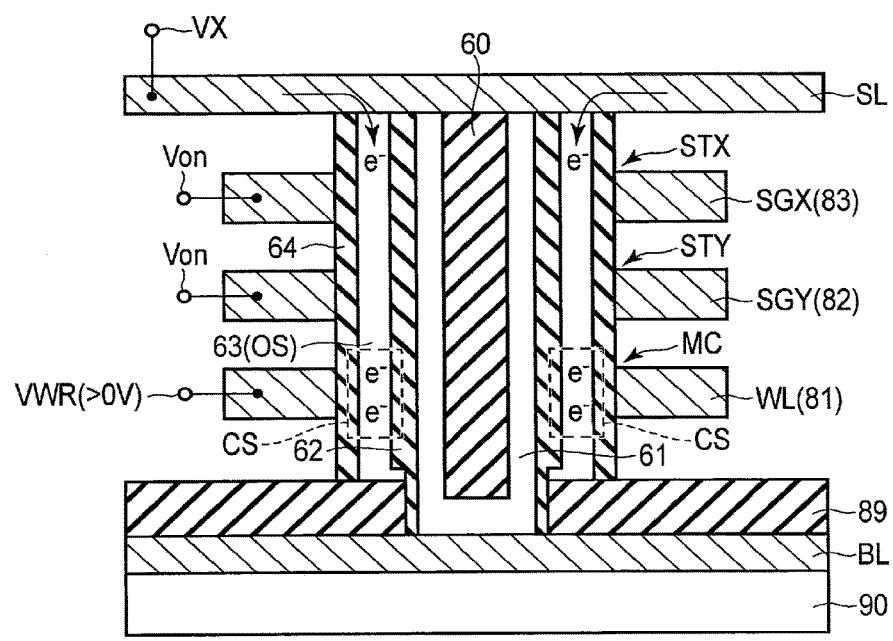
F I G. 6

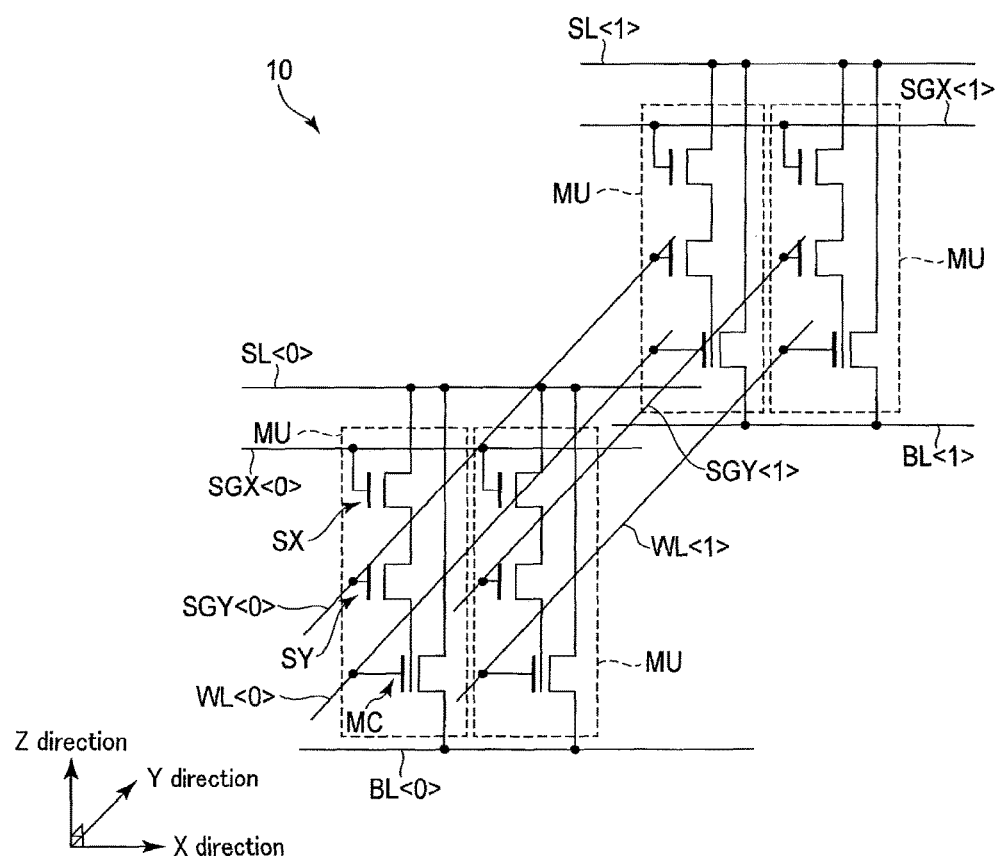
F I G. 9

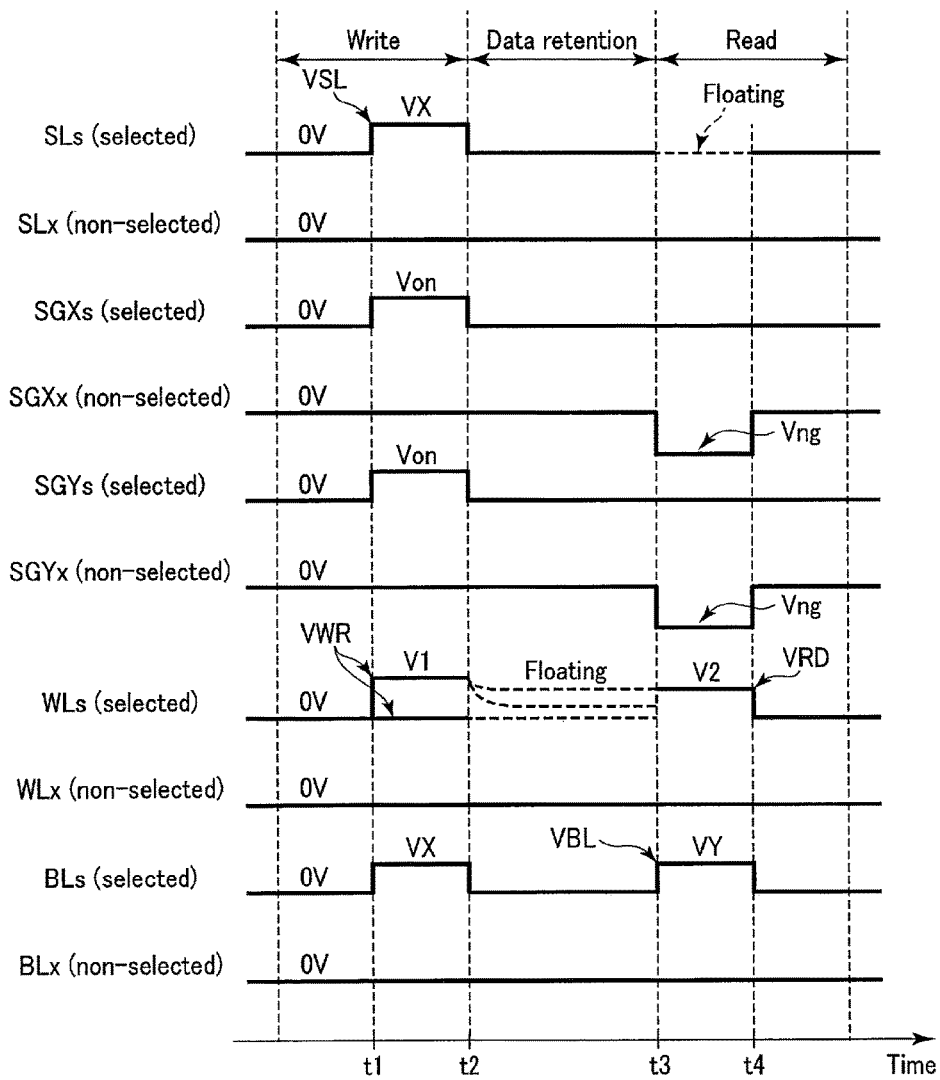
F I G. 13

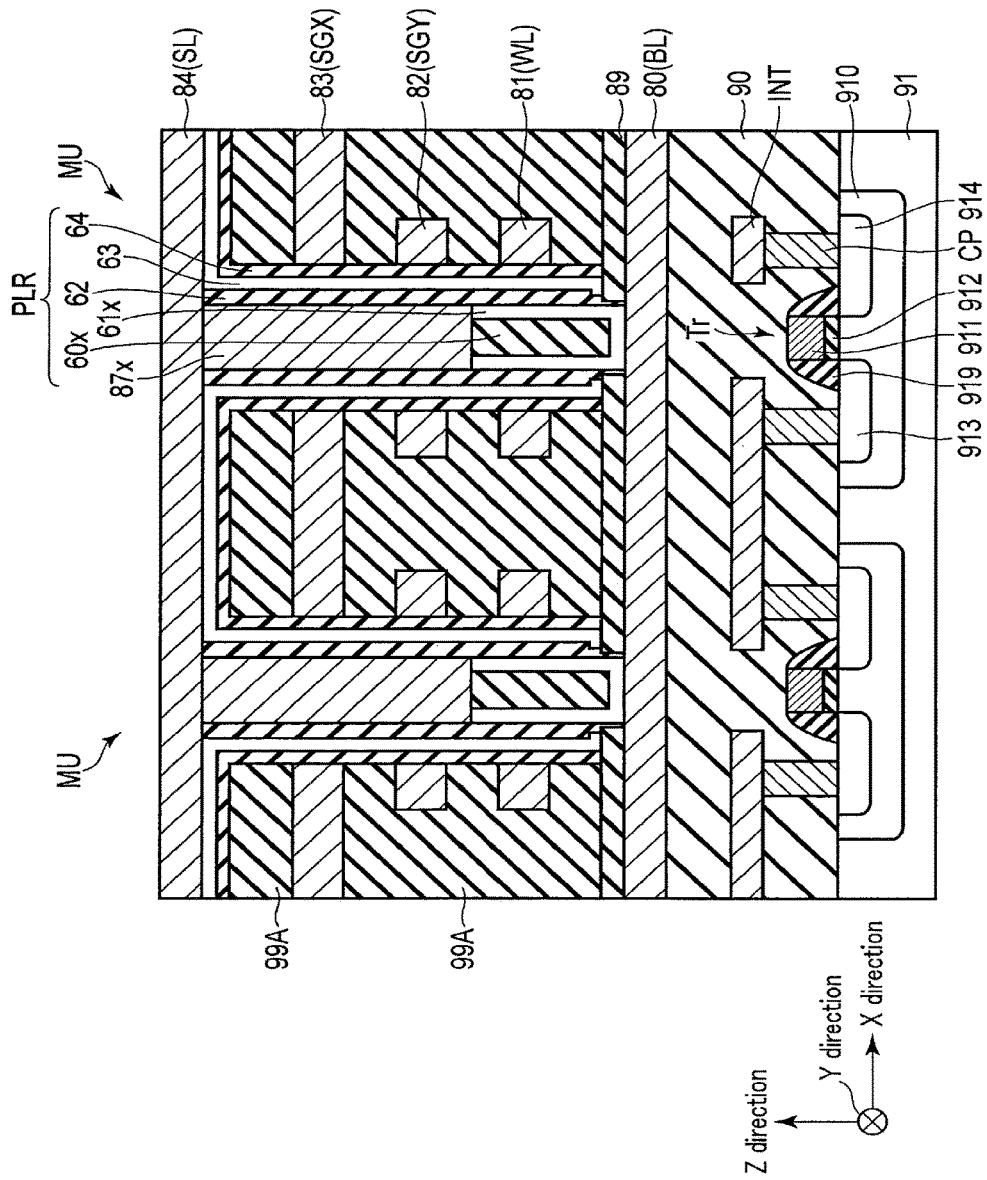
F I G. 14

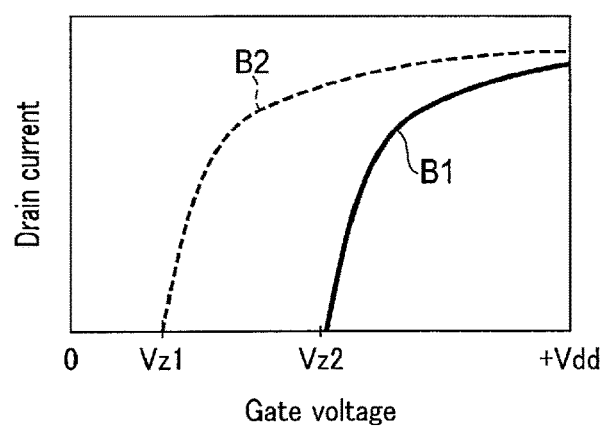
F I G. 15

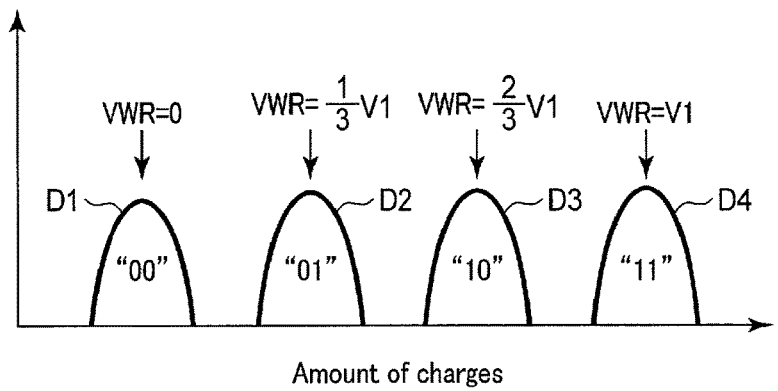
F I G. 17
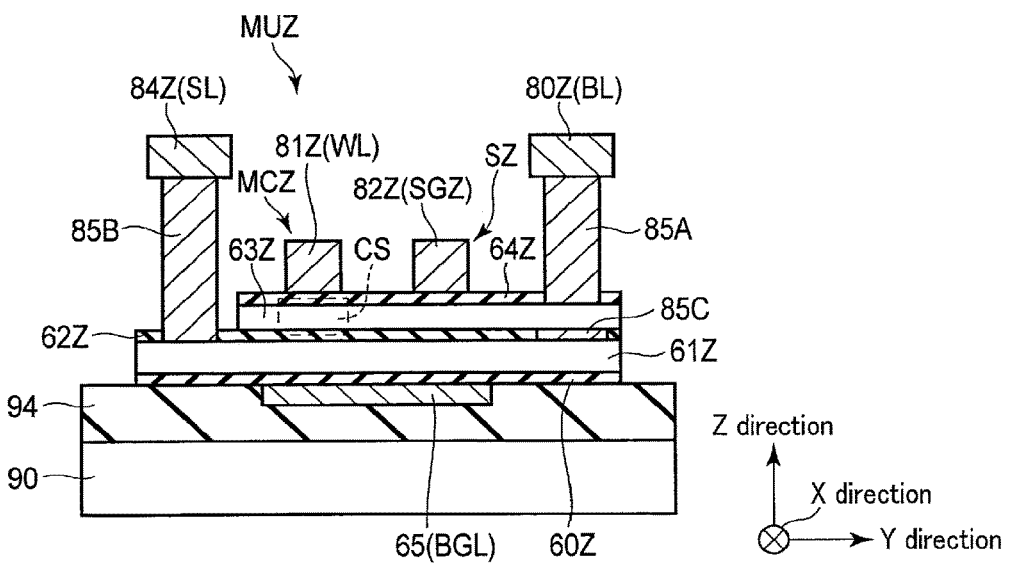
F I G. 18

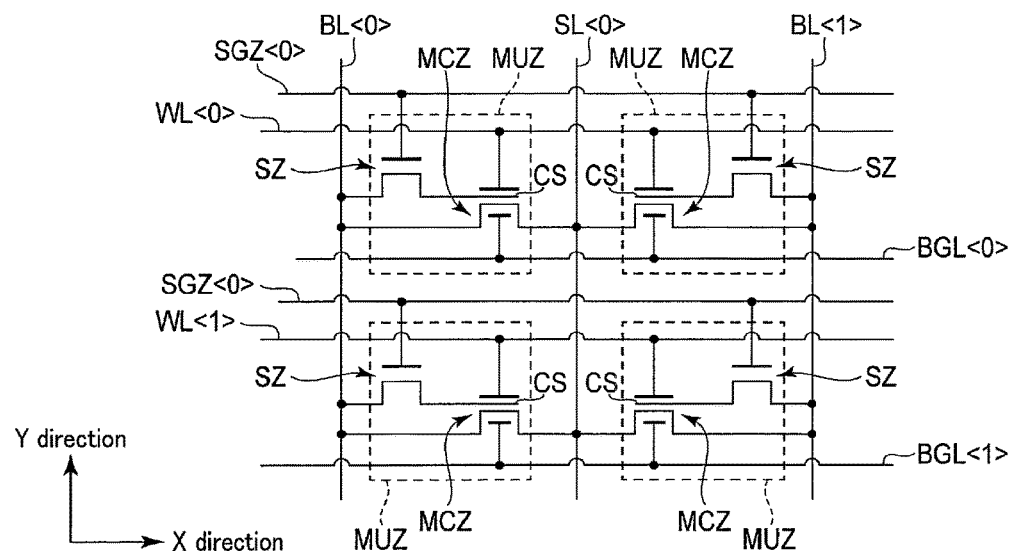
F I G. 19
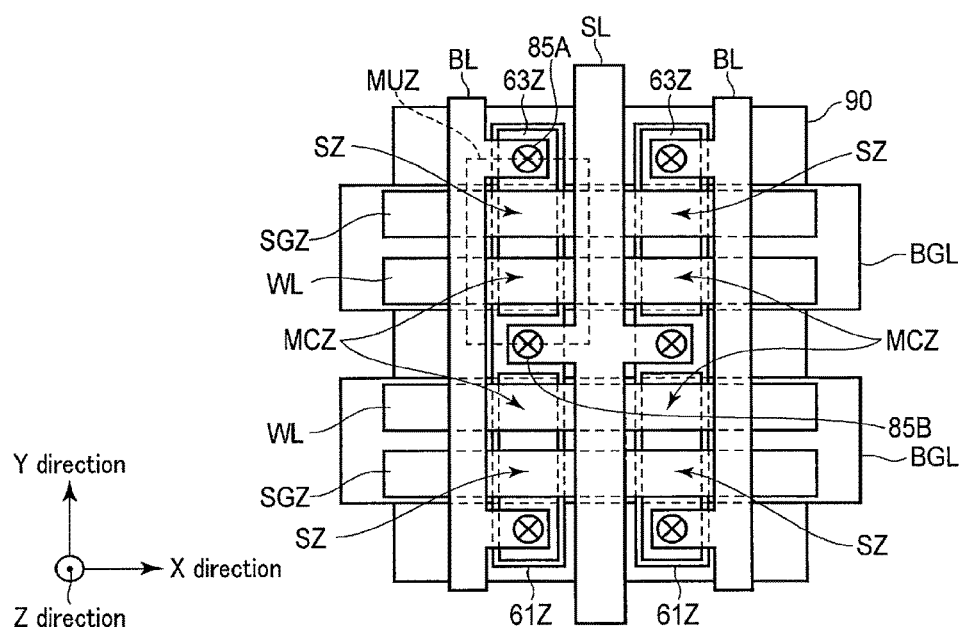
F I G. 20

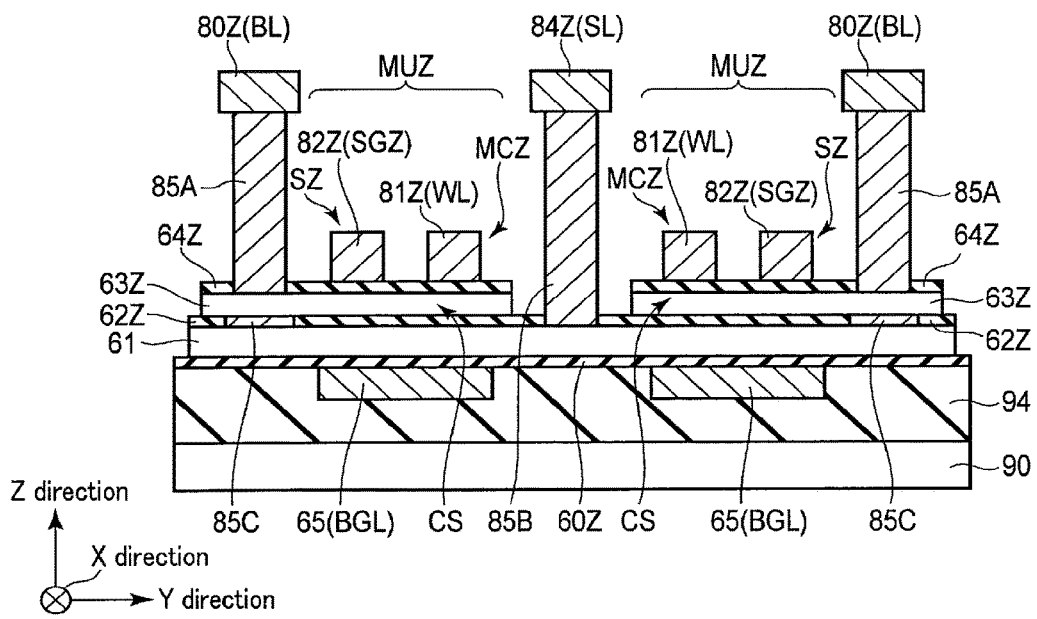
F I G. 21
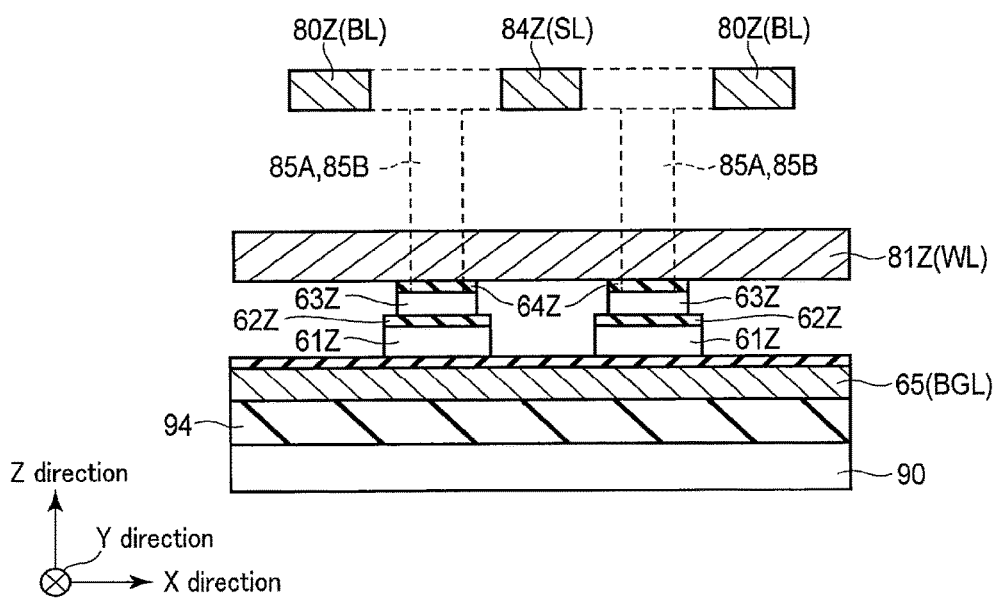
F I G. 22

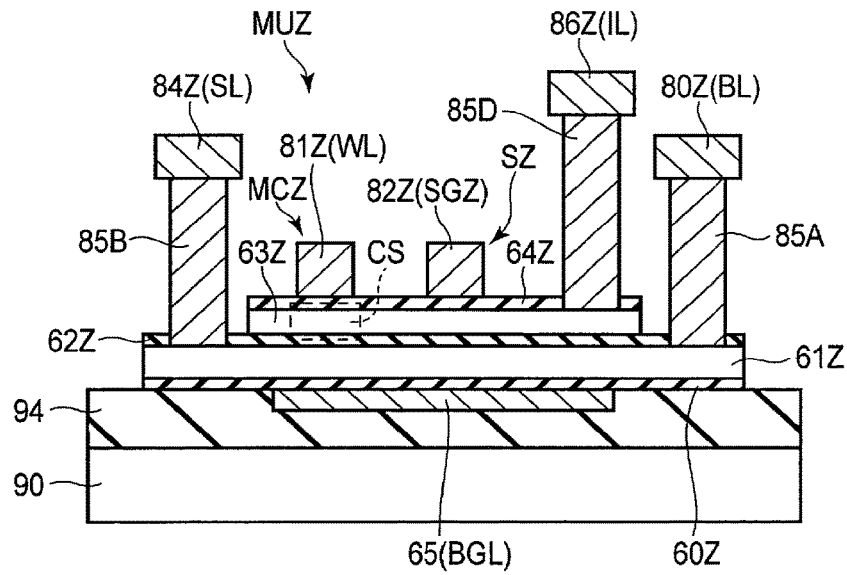
F I G. 24
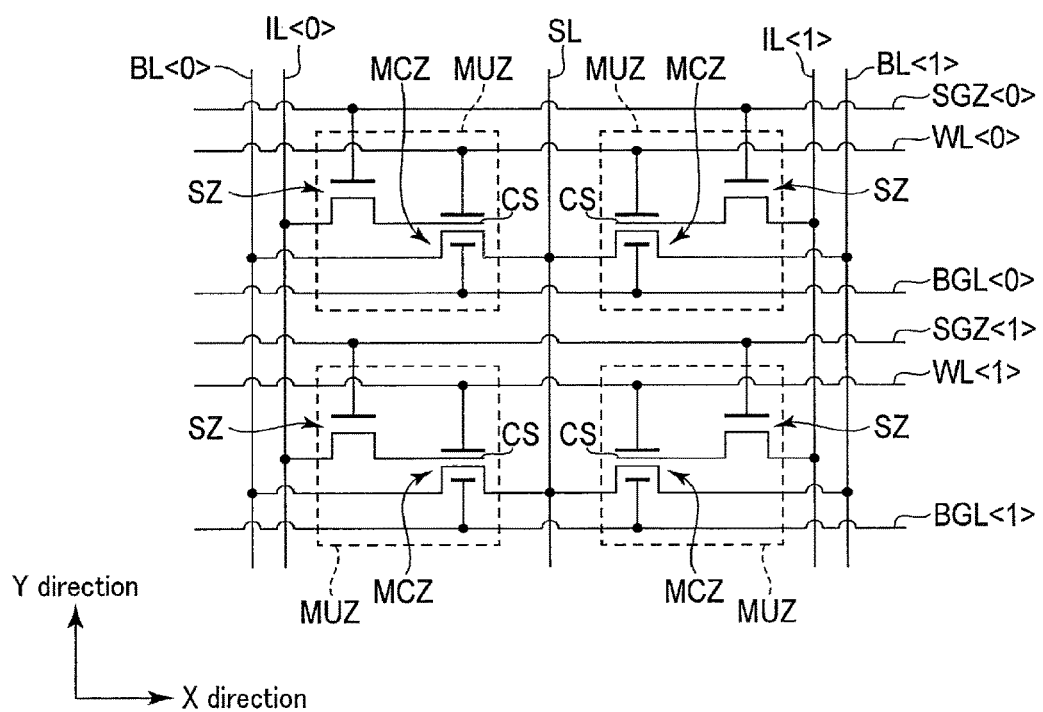
F I G. 25

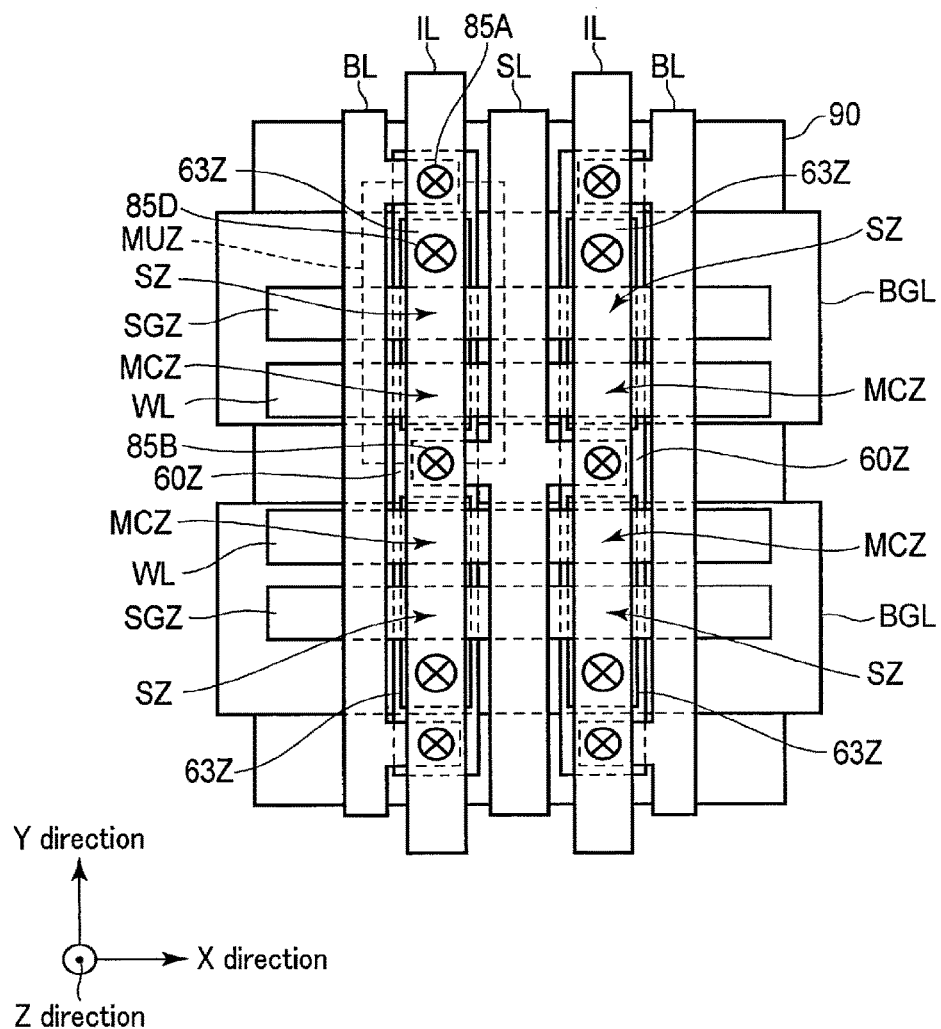
F I G. 26

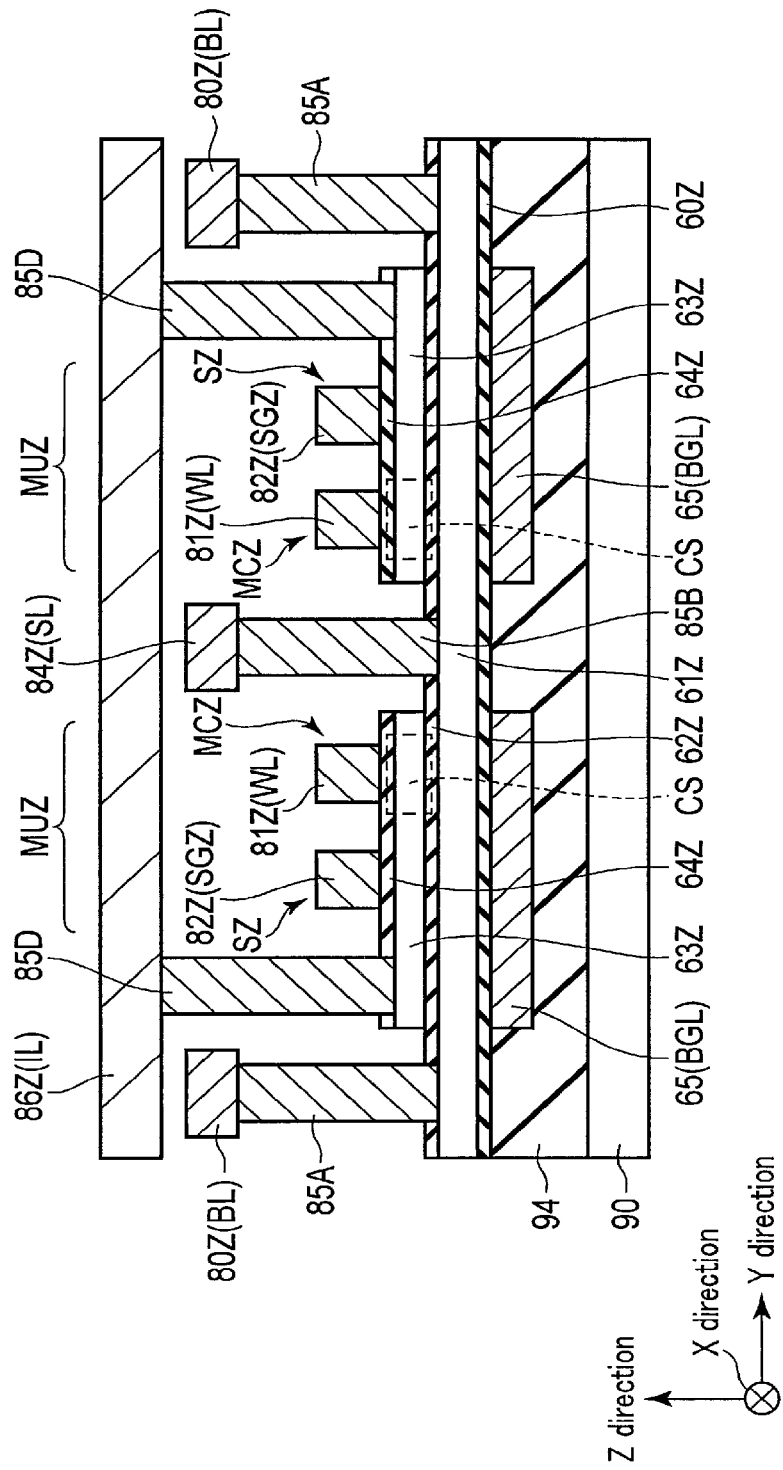
F I G. 27

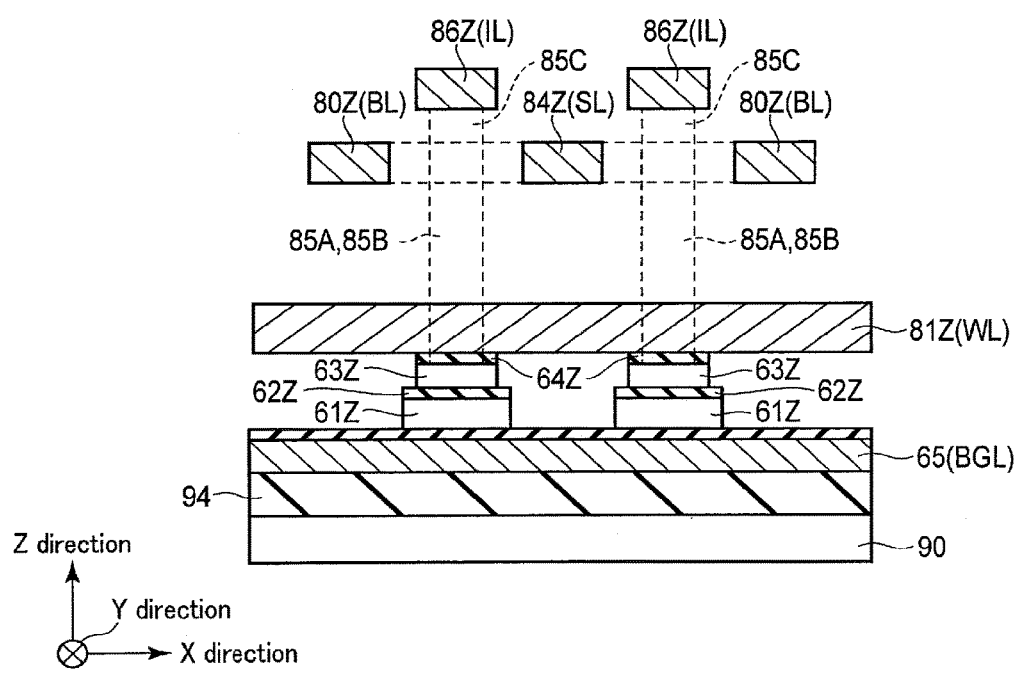
F I G. 28

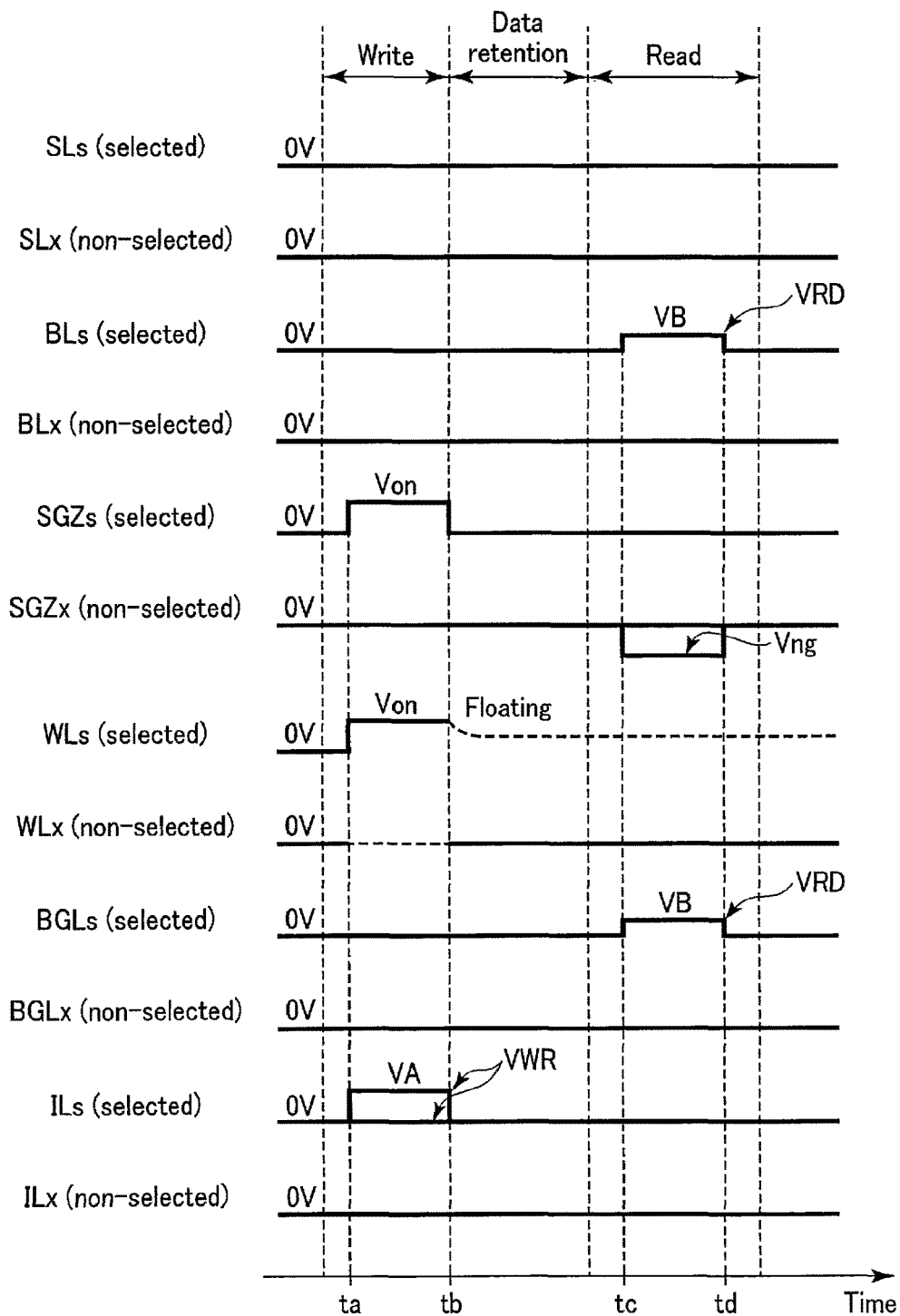
F I G. 29

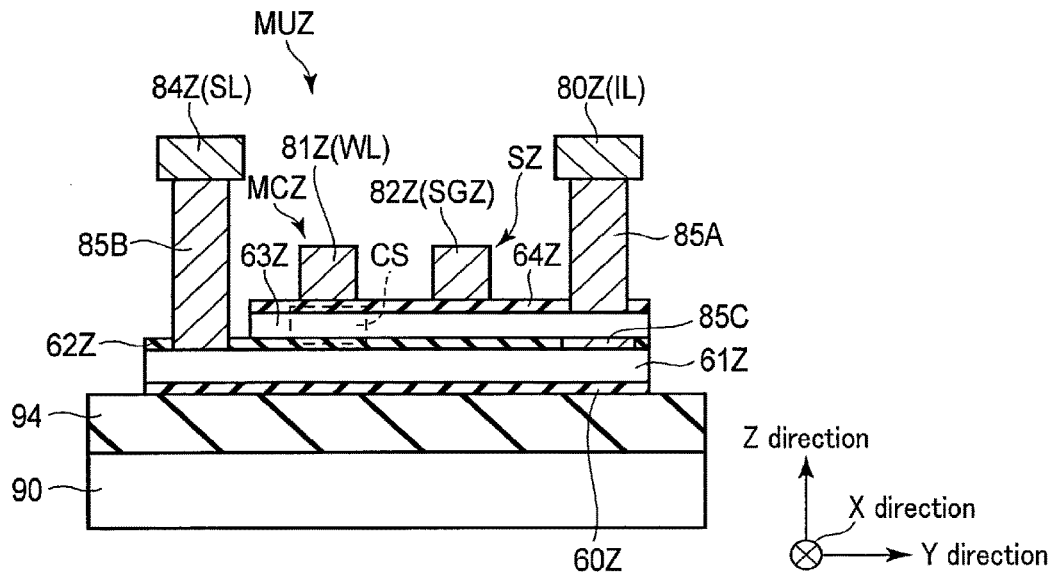
F I G. 30
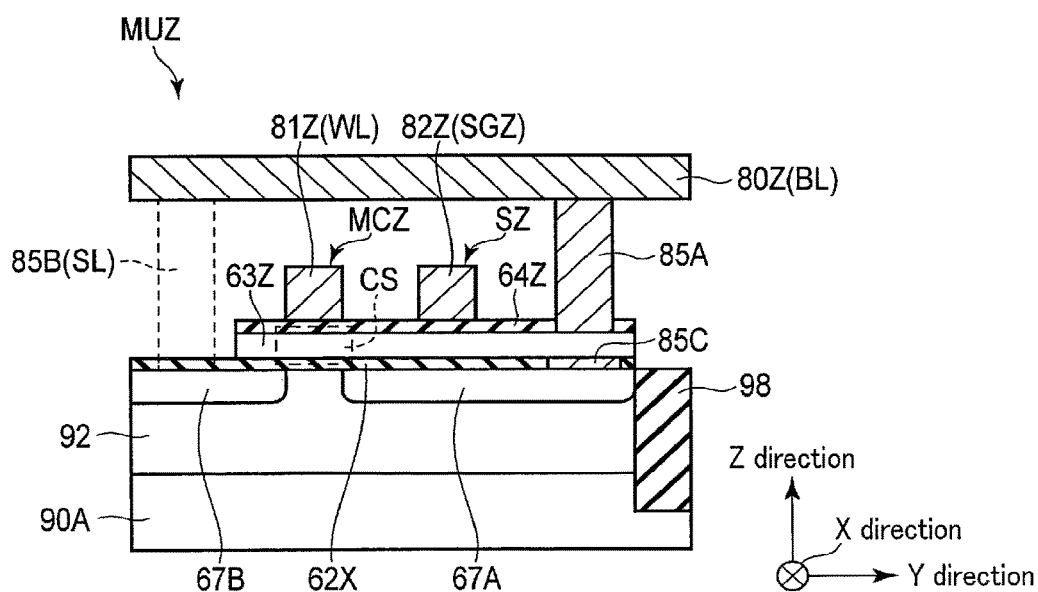
F I G. 31

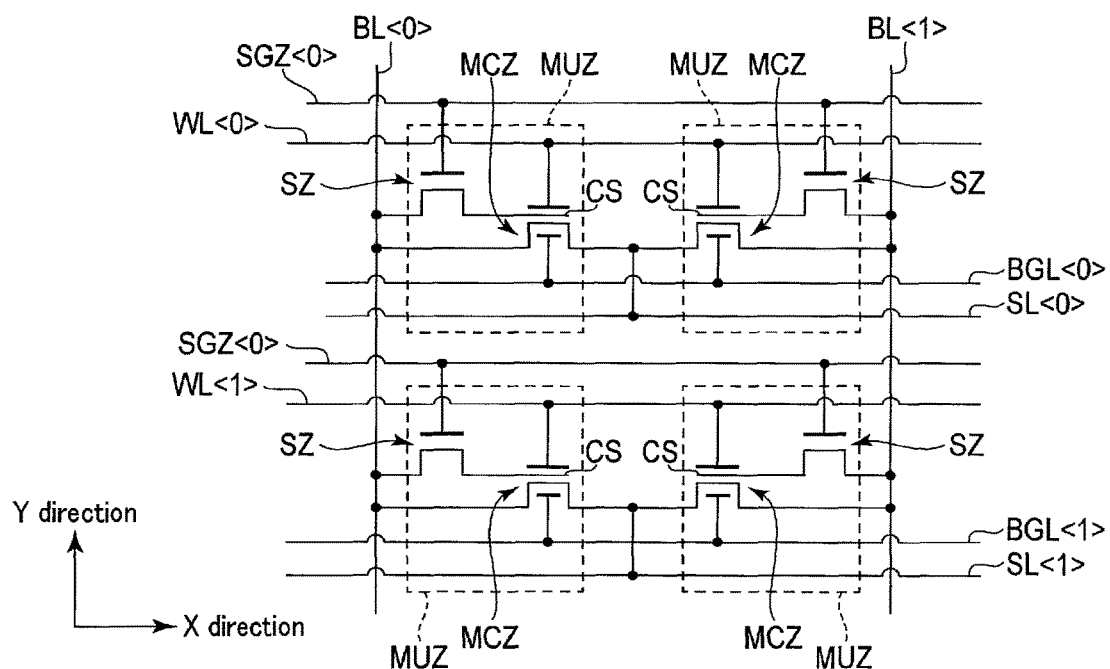
F I G. 32

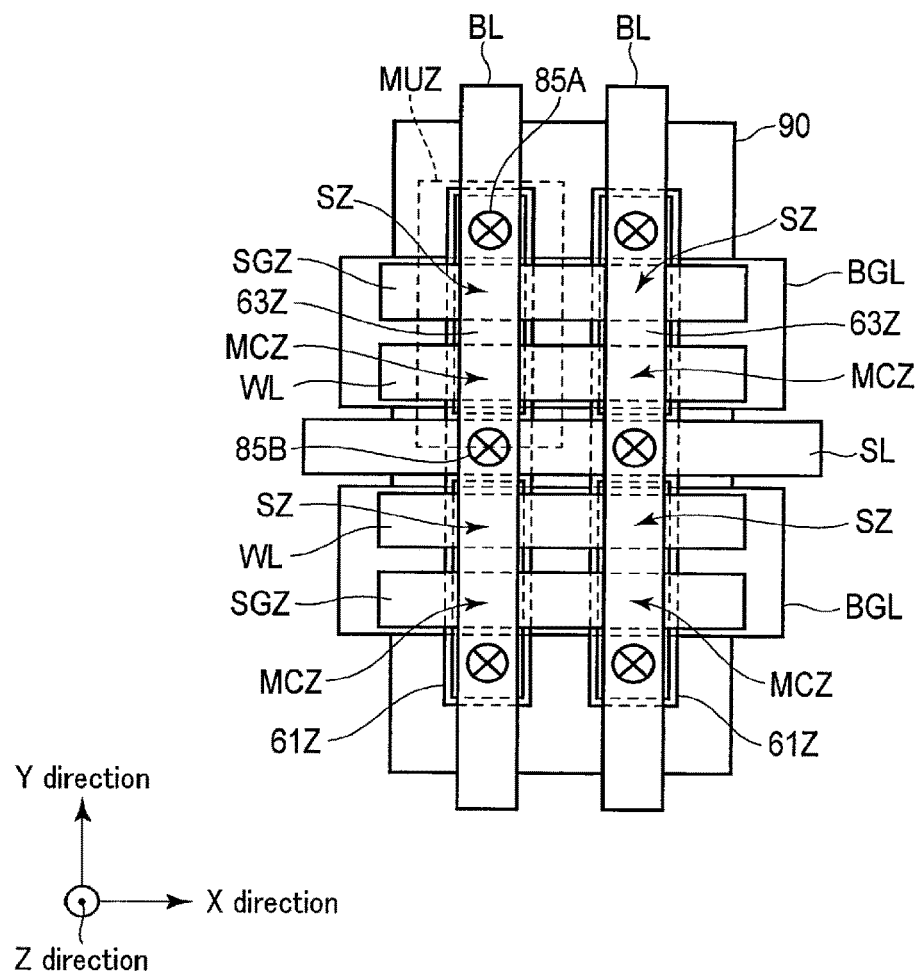
F I G. 33

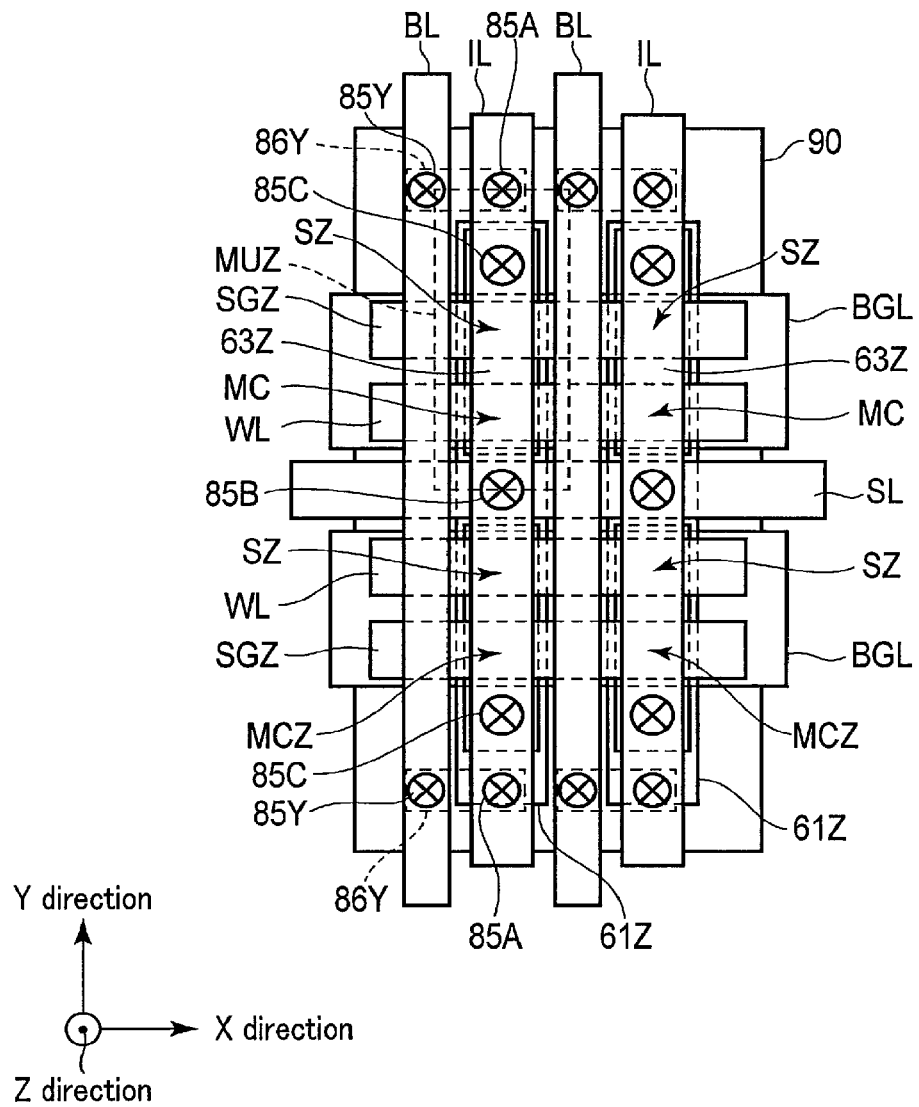
F I G. 36

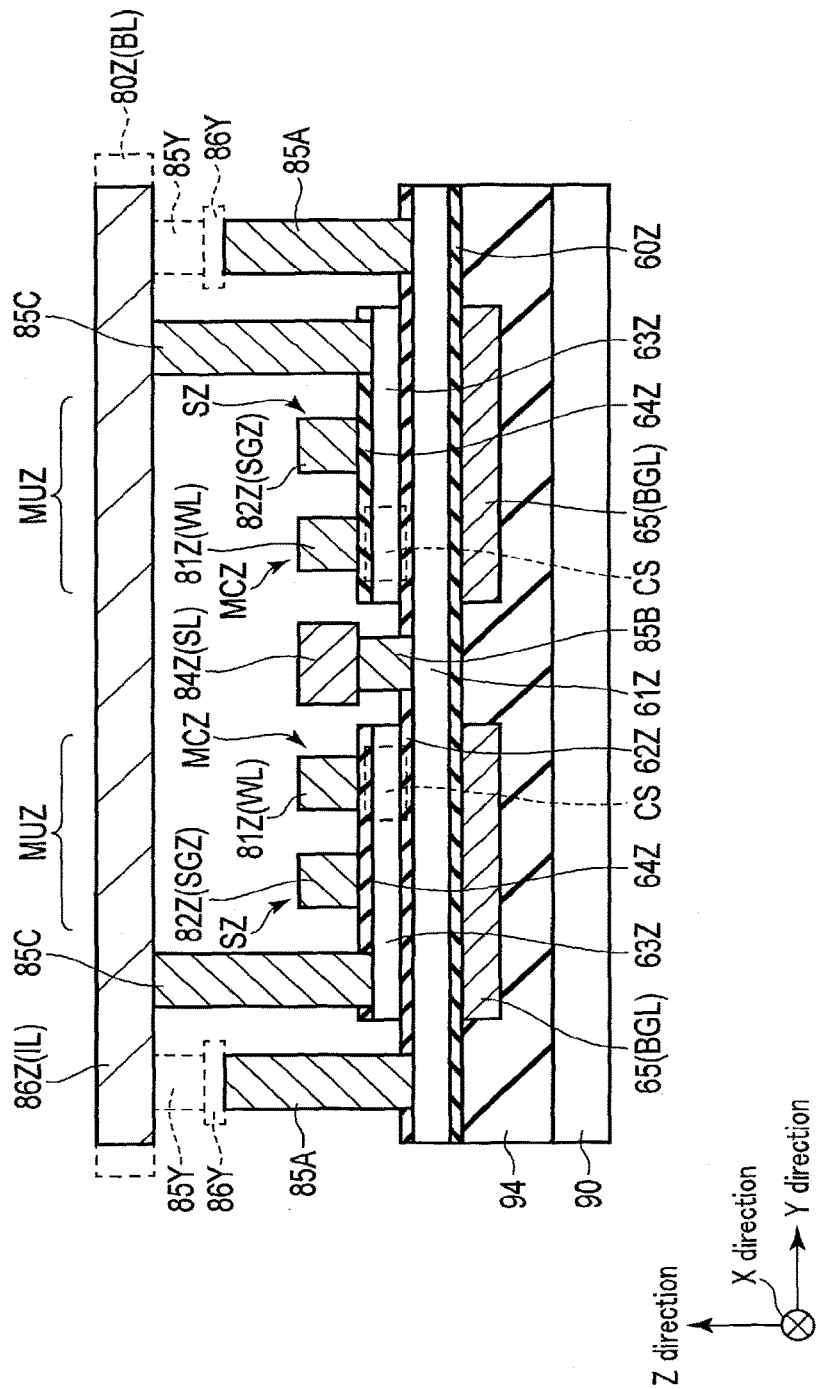
F I G. 37

SEMICONDUCTOR MEMORY INCLUDING SEMICONDUCTOR OXIE

CROSS-REFERENCE TO RELATED APPLICATIONS

This application is based upon and claims the benefit of priority from Japanese Patent Application No. 2017-051456, filed Mar. 16, 2017, the entire contents of which are incorporated herein by reference.

FIELD

Embodiments described herein relate generally to a semiconductor memory.

BACKGROUND

In recent years, the amount of data used by information terminals, the Internet, and cloud services has increased explosively. In accordance with this, memory devices are required to have increased capacity and reduce the bit cost.

An ideal memory device is a nonvolatile semiconductor device operating at high speed, having a high storage density, and having a reduced bit cost. Under the circumstances, however, there is no memory device that satisfies all these requirements, and a memory device suited for a particular purpose is provided to the user.

BRIEF DESCRIPTION OF THE DRAWINGS

FIGS. 5, 6 and 7 illustrate a basic operation performed by a semiconductor memory of the first embodiment.

FIG. 9 is an equivalent circuit diagram illustrating a specific example of a semiconductor memory of the first embodiment.

FIG. 13 is a waveform chart illustrating a specific example of a semiconductor memory of the first embodiment.

FIG. 14 is a sectional view illustrating a modification of a semiconductor memory of the first embodiment.

FIG. 15 illustrates a modification of a semiconductor memory of the first embodiment.

FIG. 17 illustrates a modification of a semiconductor memory of the first embodiment.

FIG. 18 is a sectional view illustrating a basic example of a semiconductor memory of the second embodiment.

FIG. 19 is a circuit diagram illustrating a configuration example of a semiconductor memory of the second embodiment.

FIG. 20 is a top view illustrating a configuration example of a semiconductor memory of the second embodiment.

FIGS. 21 and 22 are sectional views illustrating a configuration example of a semiconductor memory of the second embodiment.

FIG. 24 is a sectional view illustrating a basic example of a semiconductor memory of the second embodiment.

FIG. 25 is a circuit diagram illustrating a configuration example of a semiconductor memory of the second embodiment.

FIG. 26 is a top view illustrating a configuration example of a semiconductor memory of the second embodiment.

FIGS. 27 and 28 are sectional views illustrating a configuration example of a semiconductor memory of the second embodiment.

FIG. 29 is a waveform chart illustrating an operation example of a semiconductor memory of the second embodiment.

FIGS. 30 and 31 are sectional views illustrating a modification of a semiconductor memory of the second embodiment.

FIG. 32 is a circuit diagram illustrating a modification of a semiconductor memory of the second embodiment.

FIG. 33 is a top view illustrating a configuration example of a semiconductor memory of the second embodiment.

FIG. 36 is a top view illustrating a configuration example of a semiconductor memory of the second embodiment.

FIG. 37 is a sectional view illustrating a modification of a semiconductor memory of the second embodiment.

DETAILED DESCRIPTION

In general, according to one embodiment, a semiconductor memory includes: a bit line; a source line; a pillar extending in a first direction from the bit line to the source line and including an oxide semiconductor layer; first, second and third conductive layers disposed along the first direction and opposed to a side surface of the pillar; a memory cell disposed at a first intersection between the first conductive layer and the pillar, the memory cell including a charge storage layer in the oxide semiconductor layer; a first transistor disposed at a second intersection between the second conductive layer and the pillar; and a second transistor disposed at a third intersection between the third conductive layer and the pillar, wherein a first end of the oxide semiconductor layer in the first direction is in contact with the source line, and a second end of the oxide semiconductor layer in the first direction is electrically disconnected from the bit line.

Embodiments

Semiconductor memories according to embodiments will be described with reference to FIGS. 1 to 37. In the description below, elements having the same functions and configurations will be denoted by the same reference symbols. In the embodiments described below, where structural elements denoted by reference symbols having numbers or letters at the end for discrimination (e.g., word lines WL, bit lines BL, various voltages and signals) do not have to be discriminated from each other, the numbers or letters at the end are omitted.

[1] First Embodiment

A semiconductor memory according to the first embodiment will be described with reference to FIGS. 1 to 17.

(1) Basic Example

A basic example of the semiconductor memory according to the present embodiment will be described with reference to FIGS. 1 to 7.

<Configuration>

The configuration of the basic example of the semiconductor memory according to the present embodiment will be described with reference to FIGS. 1 to 3.

Figure 1:
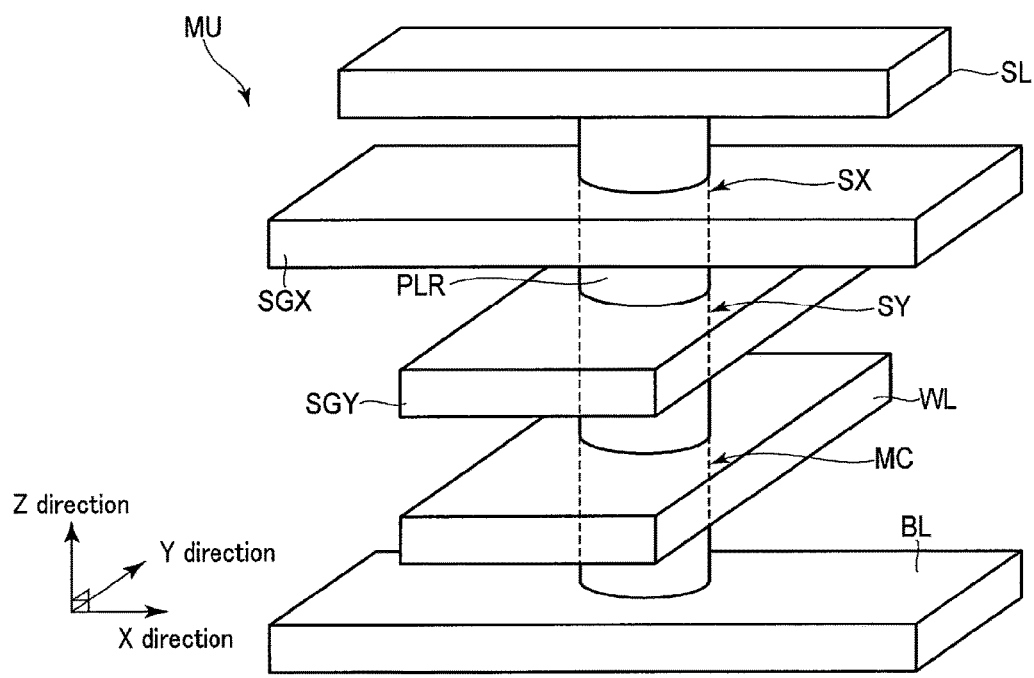
FIG. 1 is a bird's eye view illustrating a basic example of a semiconductor memory of the first embodiment.

FIG. 1 is a bird's eye view illustrating a control unit of the semiconductor memory of the present embodiment.

The semiconductor memory of the present embodiment includes a plurality of control units (basic elements) MU. In the semiconductor memory 1 of the present embodiment, the control unit MU shown in FIG. 1 is used as a basic structural element for storing data. Each control unit MU is configured to store (retain) data of not less than 1 bit. In the description given below, the control unit MU will be referred to as a memory unit.

As shown in FIG. 1, the memory unit MU includes a plurality of conductive layers (interconnects) SGX, SGY and WL and a pillar. PLR.

The memory unit MU is provided between the conductive layer serving as a source line SL and the conductive layer serving as a bit line BL. At one end in the Z direction of the memory unit MU, the source line SL is provided on the upper portion of the pillar PLR. At the other end in the Z direction of the memory unit MU, the bit line BL is provided at the lower portion of the pillar PLR. One end of the memory unit MU is connected to the bit line BL, and the other end of the memory unit MU is connected to the source line SL.

The conductive layers SGX, SGY and WL are stacked on the surface of a substrate 90 in the Z direction. Insulating layers (not shown) are provided between the respective adjacent layers of the conductive layers SL, SGX, SGY, WL and BL, which are adjacent in the Z direction. The insulating layers electrically separate the conductive layers SL, SGX, SGY, WL and BL.

The source line SL (an uppermost layer) is located at the upper end of the stack including the conductive layers SGX, SGY and WL (and the insulating layers), and the bit line BL (a lowermost layer) is located at the lower end of that stack. Conductive layer SGX is a layer which is one layer lower than the source line SL. Conductive layer WL is a layer which is one layer upper than the bit line BL. Conductive layer SGY is located between conductive layer SGX and conductive layer WL.

Conductive layer SGX extends, for example, in the x direction. Conductive layers SGY and WL extend in the Y direction, which is substantially perpendicular to the X direction. The Z direction is a direction substantially perpendicular to the two-dimensional plane defined by the X direction and the Y direction.

Conductive layer WL is used as a word line WL in the memory unit MU. Conductive layers SGX and SGY are used as cut-off gate lines in the memory unit MU. As will be described later, the data write and data retention of the memory unit MU are controlled by controlling the cut-off gate lines SGX and SGY, in addition to the bit line BL, source line SL and word line WL.

The pillar PLR is provided inside the stack of the conductive layers SGX, SGY and WL. The pillar PLR is located between conductive layers SL and BL and extends in the Z direction. The pillar PLR penetrates the conductive layers SGX, SGY and WL in the Z direction. The upper end of the pillar PLR is in contact with the bottom surface of conductive layer SL. The lower end of the pillar PLR is in contact with the upper surface of conductive layer BL. The pillar PLR has a structure in which a plurality of layers are stacked from the center of the pillar PLR to the outer periphery (X direction or Y direction) in a direction (cross section) parallel to the X-Y plane.

The memory unit MU includes a plurality of elements MC, SX and SY.

Elements MC, SX and SY are provided at respective intersections between the pillar PLR and the conductive layers WL, SGX and SGY.

Element MC is provided at the intersection between the pillar PLR and conductive layer WL extending in the Y direction. Element MC functions as a data retaining portion of the memory unit MU. Element MC retains (stores) data, using an oxide semiconductor layer included in the pillar PLR. For example, element MC is a field-effect transistor having a stacked gate structure.

In the description below, element MC will be referred to as a memory cell MC.

Element SX is provided at the intersection between the pillar PLR and conductive layer SGX extending in the X direction. Element SX is a field-effect transistor formed of the pillar PLR and conductive layer SGX. Element SX functions as an element for controlling a data retention state in the memory cell MC in the X direction. Element SX functions as a select element for selecting memory unit MU with respect to the X direction at the time of data write.

Element SY is provided at the intersection between the pillar PLR and conductive layer SGY extending in the Y direction. Element SY is a field-effect transistor formed of the pillar PLR and conductive layer SGY. Element SY functions as an element for controlling a data retention state in the memory cell MC in the Y direction. Element SY functions as a select element for selecting memory unit MU with respect to the Y direction at the time of data write.

In the description below, elements SX and SY will be referred to as cut-off transistors SX and SY.

In the memory unit MU, cut-off transistors SX and SY and the memory cell MC are arranged in the Z direction on the side surface of the pillar PLR.

Figure 2:
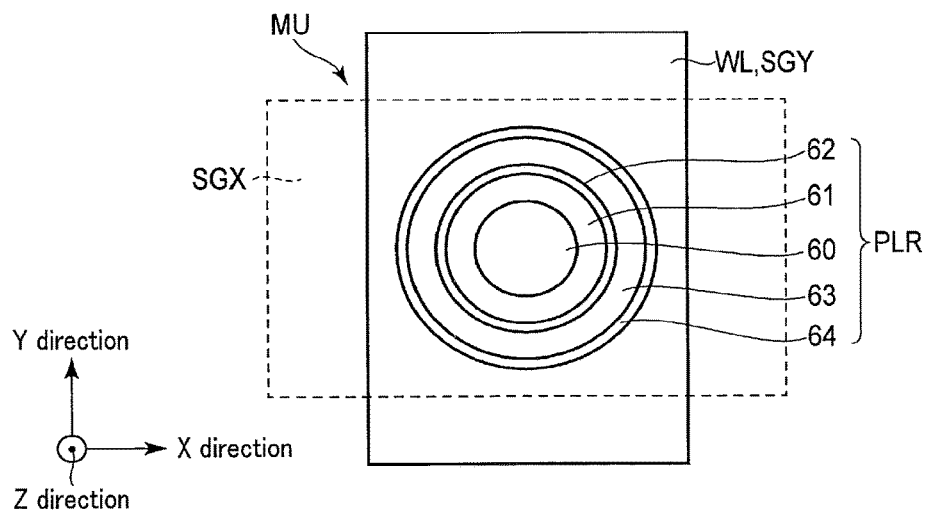
FIG. 2 is a top view illustrating a basic example of a semiconductor memory of the first embodiment.
Figure 3:
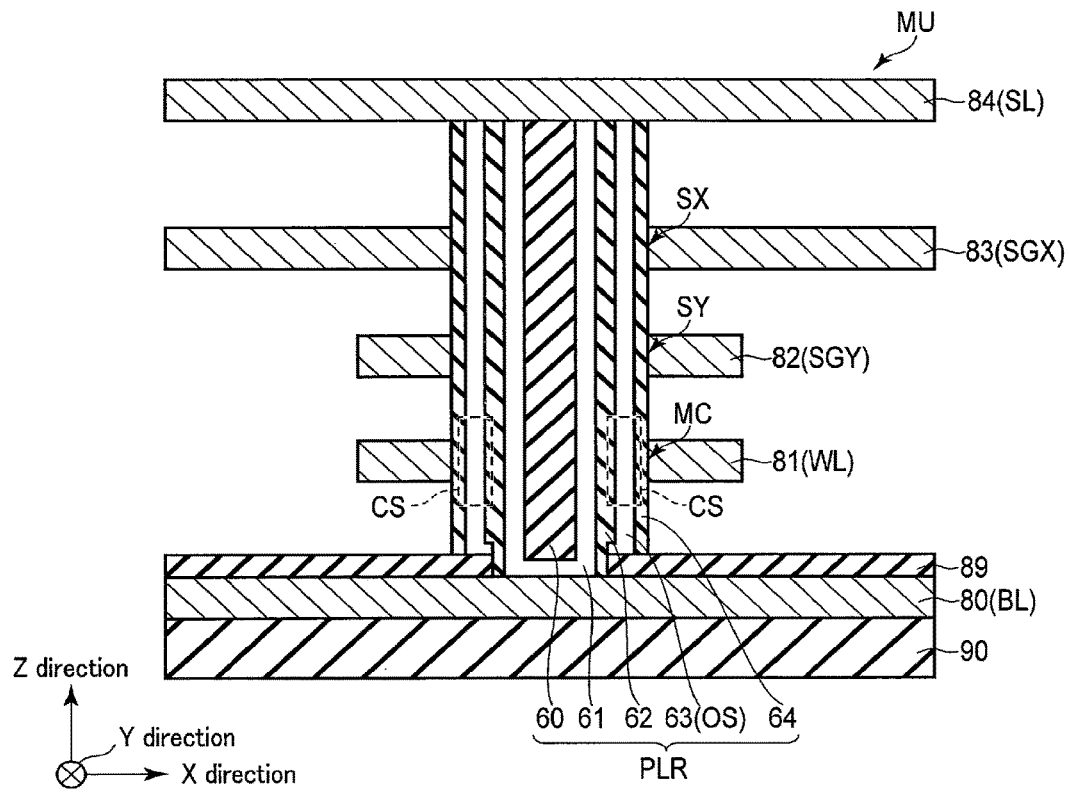
FIG. 3 is a sectional view illustrating a basic example of a semiconductor memory of the first embodiment.

FIGS. 2 and 3 are sectional views of a memory unit MU of the semiconductor memory of the present embodiment. FIG. 2 is a top view illustrating the planar structure of the memory unit MU. FIG. 3 shows a sectional structure of the memory unit MU. In FIG. 2, a section along the plane defined by the X direction and the Y direction is shown.

As shown in FIGS. 2 and 3, the pillar PLR is provided in a hole (through hole) formed in conductive layers SGX, SGY and WL (and the insulating layers). For example, the pillar PLR has a cylindrical structure.

In this case, as shown in FIG. 2, the pillar PLR includes a plurality of layers (films) which are arranged concentrically, with the Z direction as a central axis. A plurality of layers 61, 62, 63 and 64 are provided between the conductive layer WL (and conductive layers SGX and SGY and the insulating layers) and the center portion (axial portion) 60 of the pillar PLR.

Layer (axial portion) 60 has a cylindrical structure. Layer 60 is formed of an insulating material. For example, the material of layer 60 is a silicon oxide.

Layer 61 is provided on the side surface of layer 60 (the side surface is a surface parallel to the X-Y plane and will be referred to as an outer circumferential surface as well). Layer 61 is located between layer 60 and layer 62. Layer 61 has a cylindrical structure.

Layer 61 is a semiconductor layer. In the description below, layer 61 will be referred to as a semiconductor layer 61.

The material of the semiconductor layer 61 is selected from polycrystalline silicon (Si), polycrystalline germanium (Ge), polycrystalline silicon germanium (SiGe), an oxide semiconductor (e.g., InGaZnO), a two-dimensional semiconductor material (e.g., $MoS_2$ or $WSe_2$) or the like. The semiconductor layer 61 may comprise a laminated film including at least two films of these materials, for example, a laminated film of silicon and germanium or a laminated film of two or more two-dimensional semiconductor materials.

Layer 62 is provided on the side surface (outer circumferential surface) of layer 61. Layer 62 is provided between layer 61 and layer 63. Layer 62 has a cylindrical structure.

Layer 62 is formed of an insulating material. In the description below, layer 62 will be referred to as an insulating layer as well. For example, the material of the insulating layer 62 is selected from silicon oxide, silicon oxynitride, a high dielectric constant material (e.g., aluminium oxide, hafnium oxide or zirconium oxide), or the like. The insulating layer 62 may be a mixture film of these materials or a laminated film thereof.

The film thickness of the insulating layer 62 is set within the range of 1 nm to 10 nm. Desirably, the film thickness of the insulating layer 62 is set, for example, within the range of 3 nm to 7 nm.

Layer 63 is provided on the side surface (outer circumferential surface) of layer 62. Layer 63 is provided between layer 62 and layer 64. Layer 63 has a cylindrical structure.

Layer 63 is formed of an oxide semiconductor. In the description below, layer 63 will be referred to as an oxide semiconductor layer 63.

The material of the oxide semiconductor layer 63 is an oxide of indium (In), gallium (Ga), zinc (Zn) or tin (Sn), or a mixture (compound) of such oxides. For example, the material of the oxide semiconductor layer 63 is InGaZnO or InGaSnO. The material of the oxide semiconductor layer 63 may be used as the semiconductor layer 61.

The film thickness of the oxide semiconductor layer 63 is set within the range of 1 nm to 15 nm. Desirably, the film thickness of the oxide semiconductor layer 63 is set, for example, within the range of 3 nm to 10 nm.

Layer 64 is provided on the side surface (outer circumferential surface) of layer 63. Layer 64 is provided between layer 63 and conductive layer WL (and conductive layers SOX and SGY and the insulating layers).

Layer 64 is formed of an insulating material. In the description below, layer 64 will be referred to as an insulating layer as well.

Insulating Layer 64 is formed of the same material as insulating layer 62. The film thickness of insulating layer 64 is equal or nearly equal to that of insulating layer 62. The material of insulating layer 64 may be different from that of insulating layer 62. The film thickness of insulating layer 64 may be different from that of insulating layer 62.

The thicknesses of layers 61, 62, 63 and 64 are thicknesses as measured in a direction parallel to the X-Y plane.

As shown in FIG. 3, conductive layer 80 serving as bit line BL is provided on the substrate 90.

Conductive layer 81 serving as word line WL, conductive layer 82 serving as cut-off gate line SGY and conductive layer 83 serving as cut-off gate line SGX are stacked above bit line BL.

Conductive layers 81, 82 and 83 are covered with respective insulating layers (not shown).

Conductive layer 84 serving as source line SL is provided above conductive layer 83, with an insulating layer interposed.

One end (bottom portion) of the semiconductor layer 61 of the pillar PLR in the Z direction, is in direct contact with conductive layer 80. The other end (top portion) of the semiconductor layer 61 in the Z direction, is in direct contact with conductive layer 84. For example, in the bottom portion of the pillar PLR, the semiconductor layer 61 is provided between conductive layer 80 and insulating layer 60. The bottom portion of insulating layer 60 in the Z direction, is in contact with the semiconductor layer 61.

Conductive layers 80, 83 and 84 extend in the x direction, while conductive layers 81 and 82 extend in the Y direction.

In the oxide semiconductor layer 63 (OS) of the pillar PLR, the bottom portion of the oxide semiconductor layer 63 (OS) in the Z direction is in contact with insulating layer 89 formed on conductive layer 80. Insulation Layer 89 is provided between conductive layer 80 and the oxide semiconductor layer 63. The oxide semiconductor layer 63 is separated from conductive layer 80 by insulating layer 89. The upper portion of the oxide semiconductor layer 63 in the Z direction is in direct contact with conductive layer 84.

A through hole (opening portion) is provided in insulating layer 89. Insulating layer 60 and the semiconductor layer 61 are provided inside the hole of insulating layer 89. For example, in the hole of insulating layer 89, insulating layer 62 is provided between the side surface of insulating layer 89 and the side surface of the semiconductor layer 61. Neither the oxide semiconductor layer 63 nor insulating layer 64 is provided in the hole of insulating layer 89.

The bottom portion of insulating layer 62 in the Z direction is in contact with, for example, conductive layer 80. The bottom portion of insulating layer 64 in the Z direction is in contact with, for example, insulating layer 89. The upper portions of insulating layers 62 and 64 in the Z direction, are in contact with conductive layer 84.

The memory cell MC is formed of a member located near the intersection between conductive layer 81 and the pillar PLR. For example, the memory cell MC is a field-effect transistor having a stacked gate structure including a charge storage layer made of the oxide semiconductor layer 63.

Conductive layer 81 is used as word line WL, and is also used as the control gate electrode of transistor (memory cell) MC. For example, word line WL is referred to as a control gate line as well.

That portion CS of the oxide semiconductor layer 63 facing the conductive layer 81 is used as the charge storage layer CS of the memory cell MC (the charge storage layer will be referred to as a floating gate as well). Portion CS of the oxide semiconductor layer 63 functions as a data retaining portion of the memory cell MC.

The semiconductor layer 61 is used as a channel region of transistor MC. Insulating layer 62 is used as the gate insulating film of transistor MC. Insulating layer 64 functions as a block layer for separating the oxide semiconductor layer 63 from conductive layer 81. Insulating layer 64 may be used as the gate insulating film located between conductive layer (gate electrode) 81 and the oxide semiconductor layer (charge storage layer) 63.

For example, the memory cell MC is configured to exhibit the property of a normally-on transistor in the state where the oxide semiconductor layer 63 is depleted. Owing to this, the semiconductor layer 61 is an n-type semiconductor layer or a high-concentration n-type semiconductor layer ($n^+$-type semiconductor layer).

In the description below, the semiconductor layer 61 of the memory cell MC may be referred to as a sensing portion or a reading portion. The transistor portion using the semiconductor layer 61 of the memory cell MC as a channel region may be referred to as a sense transistor or a read transistor.

Cut-off transistor SY is formed of a member located near the intersection between conductive layer 82 and the pillar PLR.

Conductive layer 82 is used as cut-off gate line SGY, and is also used as the gate electrode of transistor SY. The oxide semiconductor layer 63 in transistor SY is used as the channel region between source line SL and charge storage layer CS. Insulating layer 64 of transistor SY is used as a gate insulating film for the channel region of the oxide semiconductor layer 63.

The semiconductor layer 61 in transistor SY is used as the channel region between source line SL and bit line BL. Insulating layer 62 of transistor SY is used as the gate insulating film for the semiconductor layer 61.

Cut-off transistor SX is formed of a member located near the intersection between conductive layer 81 and the pillar PLR.

Conductive layer 83 is used as cut-off gate line SGX, and is also used as the gate electrode of transistor SX. The oxide semiconductor layer 63 in transistor SX is used as the channel region between source line SL and charge storage layer CS. Insulating layer 64 in transistor SX is used as a gate insulating film for the channel region of the oxide semiconductor layer 63.

The semiconductor layer 61 in transistor SX is used as the channel region between source line SL and bit line BL. Insulating layer 62 in transistor SX is used as the gate insulating film for the semiconductor layer 61.

In the semiconductor memory of the present embodiment, the oxide semiconductor layer 63 of the memory unit MU is a film that is continuous between the memory cell MC and source line SL.

In the description below, for the sake of simplification, the channel region (current path) using the semiconductor layer 61 in transistors SX and SY may be referred to as a first current path and the channel region (current path) using the oxide semiconductor layer 63 in transistors SX and SY may be referred to as a second current path. Depending upon the operation of transistors SX and SY, the channel formed in the semiconductor layer 61 in transistors SX and SY may be a parasitic channel.

Cut-off transistors SX and SY are configured to be in the ON state when data is written in the memory cell MC. Cut-off transistors SX and SY select the memory unit MU (memory cell) in the write operation, and also serve as a path along which charges move between source line SL and charge storage layer CS.

Cut-off transistors SX and SY are configured to be in the OFF state when data is retained in the memory cell MC or read from the memory cell MC. When data is retained or read, cut-off transistors SX and SY cut off the movement of charges between the charge storage layer CS of the memory cell MC and source line SL. As a result, the charge storage layer CS can be set in the electrically floating state.

Cut-off transistors SX and SY may be referred to as cell transistors, transfer gate transistors or select transistors. Cut-off gate lines SGX and SGY may be referred to as word lines, transfer gate lines or select gate lines.

For example, the memory cell (memory unit) of the semiconductor memory of the present embodiment has a cell size of approximately $4F^2$ (the area in the X-Y plane). "F" is a minimum dimension (minimum line width) that can be formed by lithography.

The above-mentioned memory unit MU of the semiconductor memory of the present embodiment can be formed using the known film deposition technology, lithography technology and etching technology.

Figure 4:
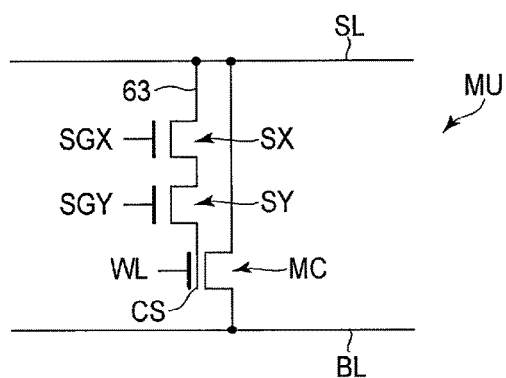
FIG. 4 is a circuit diagram illustrating a basic example of a semiconductor memory of the first embodiment.

FIG. 4 illustrates the circuit of the memory unit of the semiconductor memory of the present embodiment.

As shown in FIG. 4, one end of the memory cell MC (i.e., one of the source/drain) is connected to bit line BL. The other end of the memory cell MC is connected to source line SL.

The charge storage layer CS of the memory cell is connected to source line SL by way of the oxide semiconductor layer OS serving as the current paths of transistors SX and SY. With this configuration, the electric conduction between the charge storage layer CS and the source line SL is controlled by turning on or off transistors SX and SY.

<Principle and Operation>

The principle underlying the memory unit (memory cell) of the semiconductor memory of the present embodiment will be described with reference to FIGS. 5 to 7.

FIG. 5 illustrates the characteristics of the memory unit (memory cell) of the semiconductor memory of the present embodiment.

In FIG. 5, the abscissa of the graph represents a gate voltage of the memory cell (transistor), while the ordinate of the graph represents a drain current of the memory cell. In FIG. 5, solid line A1 indicates the V-I characteristics of the transistor when electrons are accumulated in the charge storage layer of the memory cell. Broken line A2 indicates the V-I characteristics of the transistor when electrons are depleted in the charge storage layer of the memory cell.

As described above, the memory cell MC is a normally-on transistor in the state where electrons are depleted in the charge storage layer (oxide semiconductor layer) 63. Therefore, as indicated by characteristic curve A2, the memory cell MC has a negative threshold voltage Va1 in the state where electrons are depleted in the charge storage layer 63.

When the gate voltage of the normally-on memory cell MC is 0V, the memory cell MC is in the ON state. In this case, the memory cell MC outputs a drain current whose current value is I1.

As indicated by characteristic curve A1, the threshold voltage of the memory cell MC increases in the state where electrons are accumulated in the charge storage layer 63. The memory cell MC is changed into a normally-off transistor by controlling the amount of charges in the charge storage layer 63.

For example, when the gate voltage of the normally-off memory cell MC is 0V, the memory cell MC is in the OFF state. In this case, the drain current of the memory cell is substantially 0. The memory cell MC whose charge storage layer is in the accumulation state is turned on when a gate voltage higher than a positive threshold voltage Va2 is applied thereto. Owing to this, the memory cell MC whose charge storage layer is in the accumulation state outputs a drain current.

By associating the magnitude of the drain current (the ON/OFF state of the memory cell) with data, it can be discriminated whether the memory cell MC stores "1" data or "0" data.

For example, "0" data is regarded as being stored in the memory cell MC when the charge storage layer 63 is in the depletion state, and "1" data is regarded as being stored in the memory cell MC when charge storage layer 63 is in the accumulation state.

In this case, a gate voltage of 0V is applied to the control gate electrode (word line WL) of the memory cell MC as a read voltage. By so doing, it can be discriminated based on the magnitude of the drain current whether the data in the memory cell MC is "1" data or "0" data.

As described above, the threshold voltage of the memory cell MC changes in accordance with whether there are charges (electrons) in the charge storage layer CS of the oxide semiconductor layer 63 of the memory cell MC. As a result, where a read voltage more than a predetermined value is applied to the gate of the memory cell MC, the magnitude of the drain current changes in accordance with the amount of charges in the charge storage layer CS.

By utilizing the characteristics described above, the memory cell MC of the semiconductor memory of the present embodiment can store data of 1 bit or more.

FIG. 6 is a schematic diagram illustrating how a write operation is performed for the memory unit (memory cell) of the semiconductor memory of the present embodiment.

As shown in FIG. 6, charges are stored in the charge storage layer CS of the memory cell MC when the write operation is performed.

In the semiconductor memory of the present embodiment, electrons (e⁻) are supplied from source line SL to the charge storage layer CS by way of the channel (storage layer) formed in the oxide semiconductor layer 63 in the cut-off transistors SX and SY that are in the ON state.

In the present embodiment, electrons are supplied to the charge storage layer CS of the memory cell MC (or released therefrom) in a direction parallel to the layer surface of the charge storage layer CS (the film surface of the oxide semiconductor film 63). In the present embodiment, the layer surface of the charge storage layer CS is substantially parallel to the Z direction.

To store (accumulate) charges in the charge storage layer 63, the control gate electrode 81 (word line WL) of the memory cell MC is applied with, for example, a positive voltage VWR. As a result, the memory cell MC is set in the ON state.

In the semiconductor memory of the present embodiment, when a write operation is performed for a selected memory unit MU, the gate electrodes 82 and 83 of cut-off transistors SX and SY are applied with the on voltage Von of transistor Sx and SY.

As a result, a channel is formed in the oxide semiconductor layer 63 of transistors SX and SY.

The charge storage layer CS of the memory cell MC is electrically connected to source line SL by way of the channel formed in the oxide semiconductor layer 63 of transistors SX and SY. Source line SL is applied with a voltage having voltage value VX (e.g., 0V or a positive voltage lower than voltage VWR). For example, bit line BL is applied with the same voltage as that of source line SL.

Because of the connection between source line SL and the charge storage layer 63, electrons (e⁻) are induced in the charge storage layer 63, which is opposed to the control gate electrode 81 of the memory cell MC.

In the state where the control gate electrode 81 is applied with voltage VWR, the gate electrodes 82 and 83 of cut-off transistors SX and SY are applied with the off voltage (e.g., a voltage of 0V) of transistors SX and SY. Because of the application of 0V voltage to the gate electrodes 82 and 83, the channel disappears from those portions of the oxide semiconductor layer 63 which are opposed to the gate electrodes 82 and 83. In cut-off transistors SX and SY, therefore, the channel region of the oxide semiconductor layer 63 is set in the depletion state.

As a result, the charge storage layer CS, in which the charges of the memory cell MC are accumulated, is electrically disconnected from source line SL.

Since cut-off transistors SX and SY are in the OFF state, electrons are prevented from leaking from the charge storage layer CS to source line SL.

After the charge storage layer CS is electrically disconnected from source line SL, the control gate electrode 81 of the memory cell MC is set in the electrically floating state or set to 0V. In addition, a voltage of 0V is applied to source line SL and bit line BL.

Because of this, the memory cell MC is kept in the state where electrons are stored (accumulated) in the charge storage layer CS.

Since charges are stored in the charge storage layer CS, the memory cell MC is changed into a normally-off transistor.

To set the charge storage layer CS of the memory cell MC in the depletion state, voltage VWR of 0V is applied to the control gate electrode (word line) of the memory cell MC when a channel is generated in the oxide semiconductor layer 63 of cut-off transistors SX and SY.

Because of this, electrons are released from the charge storage layer CS, without the electrons being induced in the charge storage layer CS of the memory cell MC. As a result, the charge storage layer 63 of the memory cell MC is set in the depletion state.

In the manner mentioned above, data is written in the memory cell MC in the semiconductor memory of the present embodiment.

As described above, the charge storage layer CS switches between the state where electrons are stored and the state where no electron is stored, and because of this, the memory cell MC can retain 1-bit data.

A description will be given with reference to FIG. 7 as to how the memory cell retains data in the semiconductor memory of the present embodiment.

Figure 7:
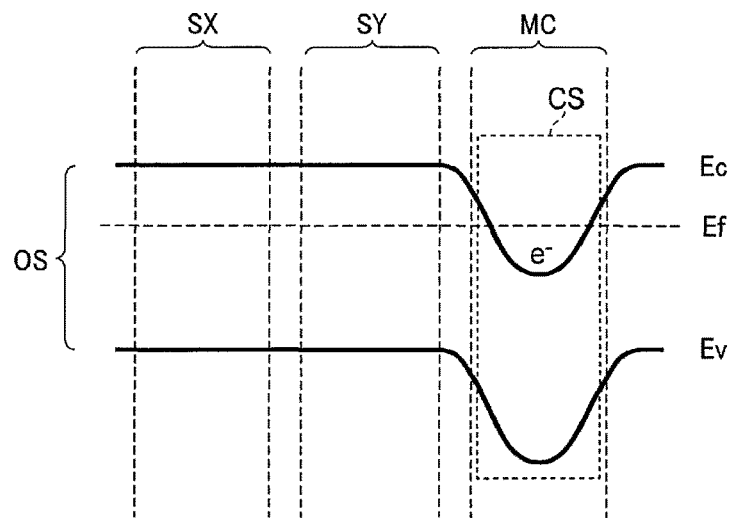

FIG. 7 is a schematic diagram illustrating how the band gap state is when data is retained in the memory cell in the semiconductor memory of the present embodiment. In FIG. 7, energy Ec at the lower end of the conduction band of the oxide semiconductor used for the charge storage layer and energy Ev at the upper end of the valence band are shown based on the positional relationships between the memory cell MC and the cut-off transistors SX and SY.

As shown in FIG. 7, the memory cell MC and cut-off transistors SX and SY are provided on the continuous oxide semiconductor layer OS.

When electrons (e⁻) are accumulated in the charge storage layer CS, energy level Ec of the oxide semiconductor layer OS in the memory cell MC is lower than Fermi level Ef.

The band gap of the oxide semiconductor used for the charge storage layer CS (namely, the difference between energy Ec and energy Ev) is approximately three times as large as the band gap of silicon. For example, the band gap of InGaZnO is approximately 3.5 eV.

For this reason, even when electrons (e⁻) are stored in the charge storage layer CS of the memory cell, the leakage of electrons due to the band-to-band tunneling between the conduction band and the valence band of the oxide semiconductor is negligible.

Therefore, unless cut-off transistors Sx and SY are both turned on, the electrons in the charge storage layer CS of the memory cell MC are retained in the oxide semiconductor layer OS, and are not released to source line SL.

Even if the charge storage layer CS of the memory cell MC is not a floating gate isolated from the other members, the memory cell MC of the semiconductor memory of the present embodiment can retain data in a substantially nonvolatile manner.

(2) Specific Example

A specific example of the semiconductor memory according to the present embodiment will be described with reference to FIGS. 8 to 13.

<Circuit Configuration>

Figure 8:
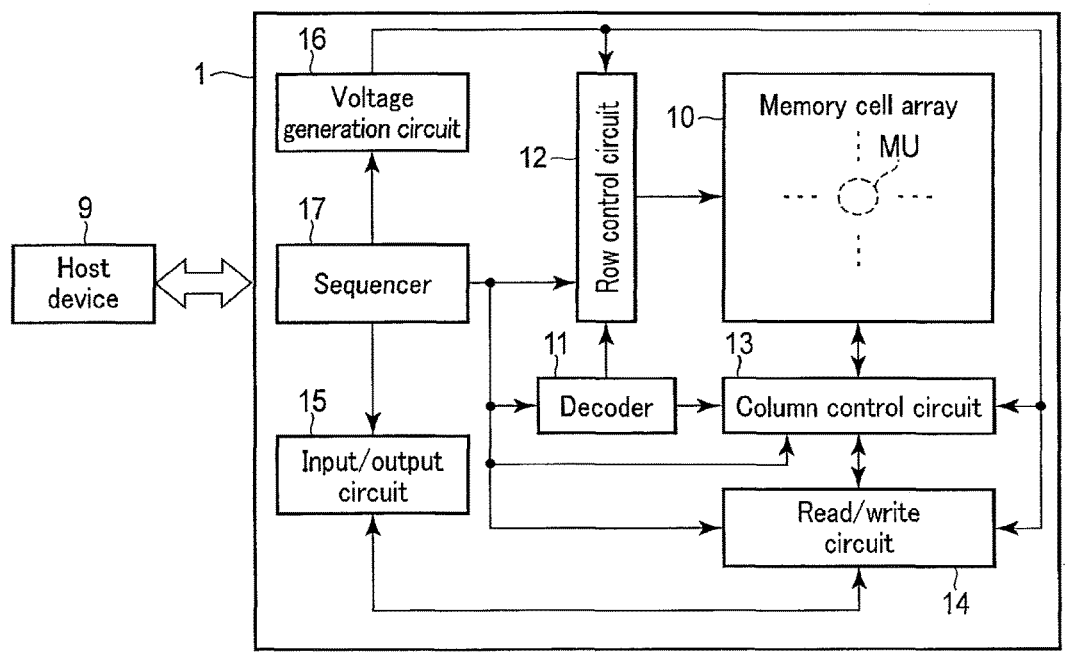
FIG. 8 is a block diagram illustrating a specific example of a semiconductor memory of the first embodiment.

FIG. 8 is a block diagram illustrating a configuration example of the semiconductor memory of the present embodiment.

As shown in FIG. 8, the semiconductor memory 1 of the present embodiment is electrically connected to a host device 9. The host device 9 is, for example, a memory controller or a processor (e.g., a CPU).

The semiconductor memory 1 operates in response to a request or an instruction supplied from the host device 9. The host device 9 is provided externally of the semiconductor memory 1. The semiconductor memory 1 may be provided inside the host device 9, if so desired.

When operating the semiconductor memory 1, the host device 9 transmits a command, addresses and various control signals to the semiconductor memory 1.

When a write operation is performed for the semiconductor memory 1, the host device 9 transmits data to be written (data to be recorded) to the semiconductor memory 1, together with a write command. When a read operation is performed for the semiconductor memory 1, the host device 9 receives data read from the semiconductor memory 1, as a response to a read command.

The semiconductor memory 1 of the present embodiment includes a memory cell array 10, a decoder 11, a row control circuit 12, a column control circuit 13, a write/read circuit 14, an input/output circuit 15, a voltage generation circuit 16 and a sequencer 17.

The memory cell array 10 includes a plurality of memory units MU.

The memory cell array 10 includes one or more sub arrays. Each sub array includes a plurality of bit lines (e.g., 256 to 4096 bit lines), a plurality of source lines SL (e.g., 256 to 4096 source lines), and a plurality of word lines (e.g., 8 to 512 word lines).

Where the memory cell array 10 includes one or more sub arrays, the sub array or each sub array includes a plurality of first cut-off gate lines SGX (e.g., 256 to 4096 lines) and a plurality of cut-off gate lines SGY (e.g., 8 to 512 lines).

The decoder 11 decodes addresses supplied from the host device 9. A row address of the memory cell array 10 and a column address of the memory cell array 10 are decoded by the decoder 11.

The row control circuit 12 controls the rows of the memory cell array 10, based on the decoded address results obtained by the decoder 11. The row control circuit 12 selects a memory unit MU corresponding to the row address decoded with respect to the X direction of the memory cell array 10. For example, the row control circuit 12 includes a word line driver (word line selection circuit).

The column control circuit 13 controls the columns of the memory cell array 10, based on the decoded address results obtained by the decoder 11. The column control circuit 13 selects a memory unit MU corresponding to the column address decoded with respect to the Y direction of the memory cell array 10. For example, the column control circuit 13 includes a bit line driver (bit line selection circuit).

The write/read circuit 14 performs a data write operation and a data read operation for the memory unit MU selected in the memory cell array 10, based on the write command and read command. For example, the write/read circuit 14 include a write driver (and a sinker), a read driver and a sense amplifier.

The input/output circuit 15 functions as an internal interface of the semiconductor memory 1. The input/output circuit 15 receives data, a command, a control signal and addresses supplied from the host device 9. The input/output circuit 15 supplies data received from the memory cell array 10 to the host device 9. For example, the input/output circuit 15 includes a latch circuit that can temporarily store data, a command, a signal and addresses.

The voltage generation circuit 16 generates various voltages used for the write operation and the read operation. The voltage generation circuit 16 supplies the generated voltages to the row control circuit 12, column control circuit 13 and write/read circuit 14.

Based on a command and a control signal, the sequencer 17 controls the operations of circuits 10-16 of the semiconductor memory 1 such that the operation requested or instructed by the host device 9 can be executed.

For example, the semiconductor memory 1 of the present embodiment is a random access memory employing an oxide semiconductor as a charge storage layer (memory film).

FIG. 9 is an equivalent circuit diagram of a random-access memory cell array according the present embodiment. In connection with FIG. 9, a description of contents substantially similar to those explained with reference to FIG. 4 will be omitted.

In FIG. 9, only the memory units MU arranged in the 2×2 matrix, which are included in the memory units arranged in the m×n matrix of the memory cell array, are illustrated for the sake of simplicity. The symbols m and n are natural numbers not less than 2.

As shown in FIG. 9, in the memory cell array 10, a plurality of memory units MU (four memory units in this example) are arranged in the X direction and in the Y direction.

A plurality of source lines SL (SL<0> and SL<1>) (two source lines in this example) are arranged in the memory cell array 10 in accordance with the number of memory units MU. A plurality of memory units MU (two memory units in this example) arranged in the X direction are connected at one end to each source line SL.

A plurality of bit lines BL (BL<0> and BL<1>) (two bit lines in this example) are arranged in the memory cell array 10 in accordance with the number of memory units MU. A plurality of memory units MU (two memory units in this example) arranged in the X direction are connected at the other end to each bit line BL.

A plurality of cut-off gate lines SGX (SGX<0> and SGX<1>) (two cut-off gate lines in this example) are arranged in the memory cell array 10 in accordance with the number of memory units MU. Each cut-off gate line SGX is connected to the gates of cut-off transistors SX of a plurality of memory units MU (two memory units in this example) arranged in the X direction.

A plurality of cut-off gate lines SGY (SGY<0> and SGY<1>) (two cut-off gate lines in this example) are arranged in the memory cell array 10 in accordance with the number of memory units MU. Each cut-off gate line SGY is connected to the gates of cut-off transistors SY of a plurality of memory units MU (two memory units in this example) arranged in the Y direction.

A plurality of word lines WL (WL<0> and WL<1>) (two word lines in this example) are arranged in the memory cell array 10 in accordance with the number of memory units MU. Each word line WL is connected to the gates of memory cells MC of a plurality of memory units MU (two memory units in this example) arranged in the Y direction.

As can be seen from the above, the charge storage layer (oxide semiconductor layer) CS of memory cell MC is connected to source line SL by way of the channel region of the oxide semiconductor layer 63 of transistors SX and SY.

<Configuration Example>

A configuration example of the memory cell array of the semiconductor memory (e.g., random access memory) of the present embodiment will be described with reference to FIGS. 10 to 12.

Figure 10:
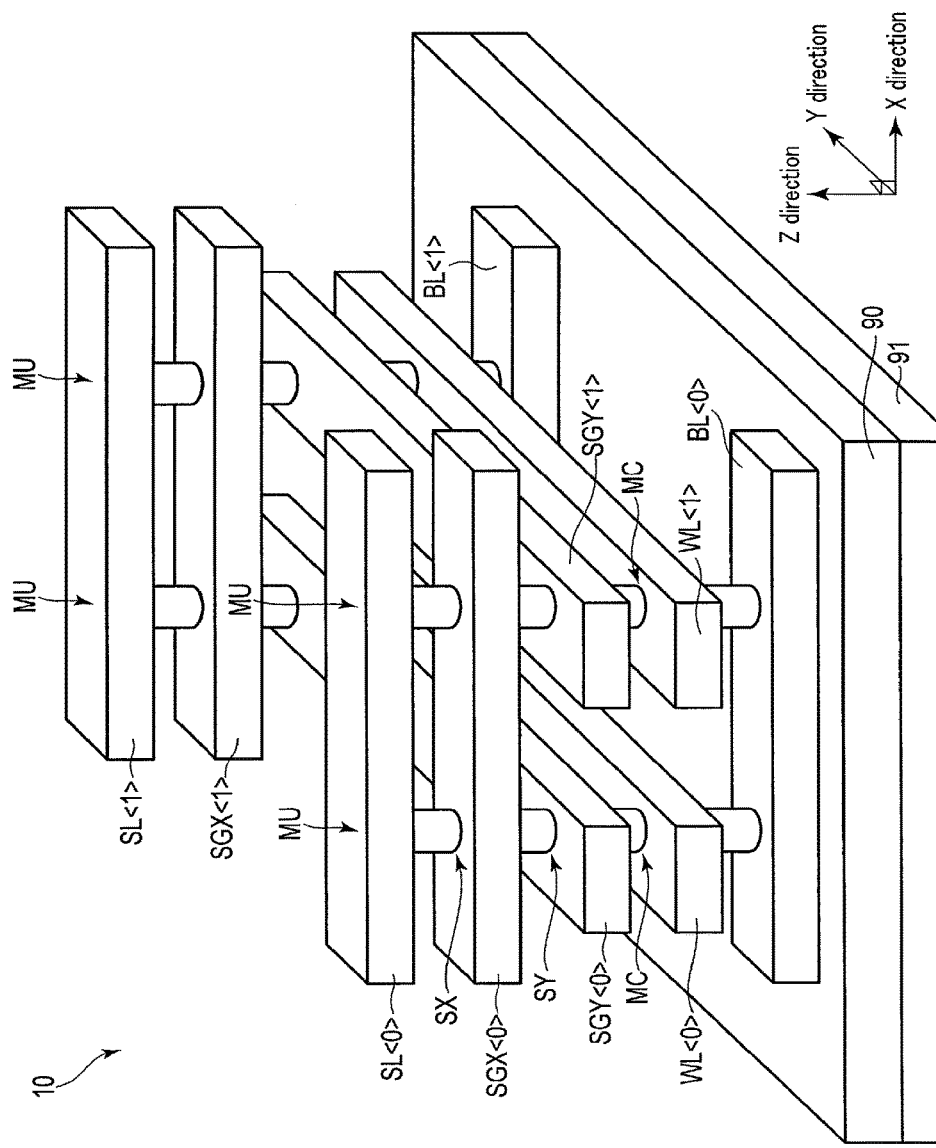
FIG. 10 is a bird's eye view illustrating a specific example of a semiconductor memory of the first embodiment.

FIG. 10 is a bird's eye view illustrating the configuration example of the memory cell array of the semiconductor memory of the present embodiment.

Figure 11:
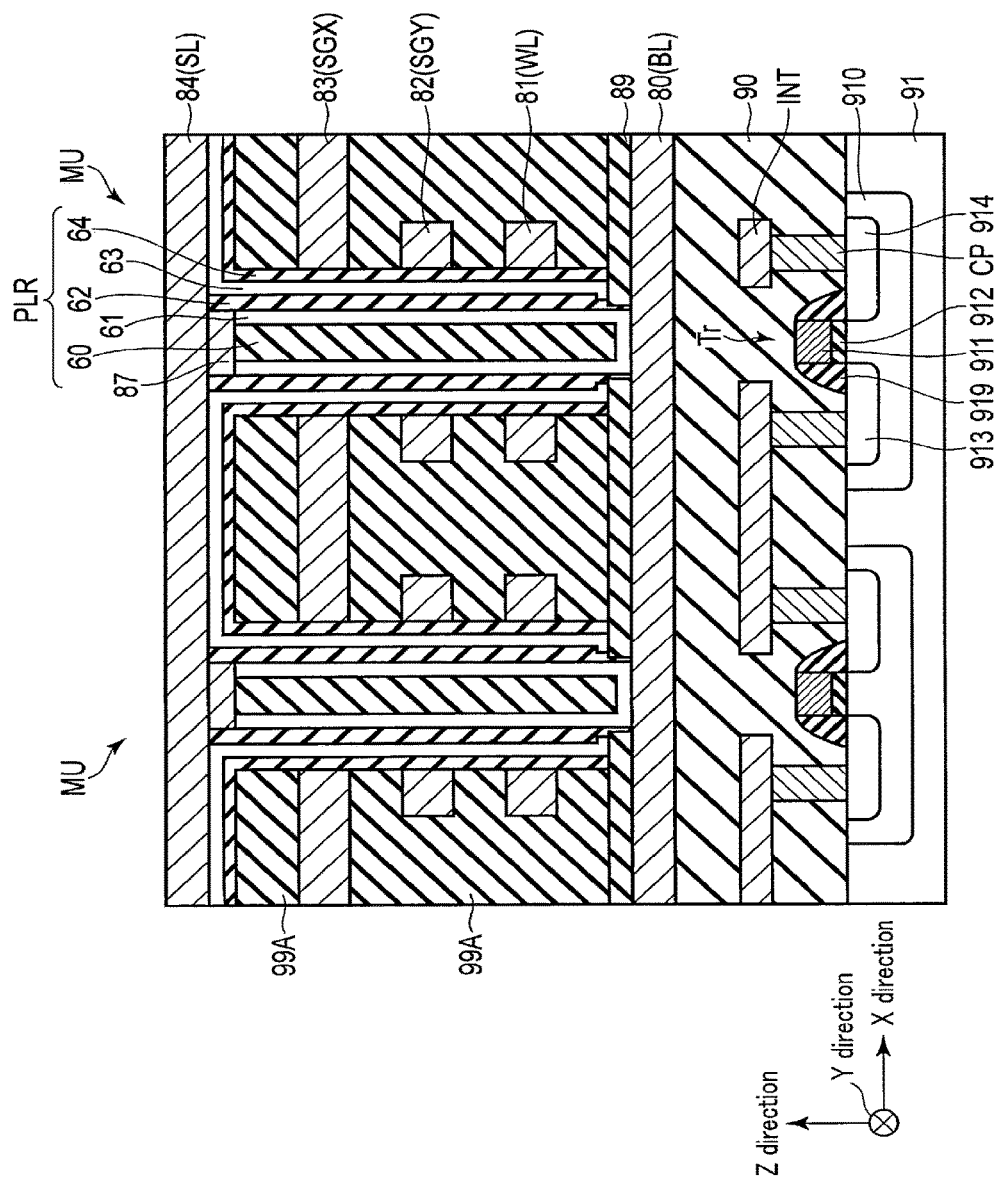
FIGS. 11 and 12 are sectional views illustrating a specific example of a semiconductor memory of the first embodiment.
Figure 12:
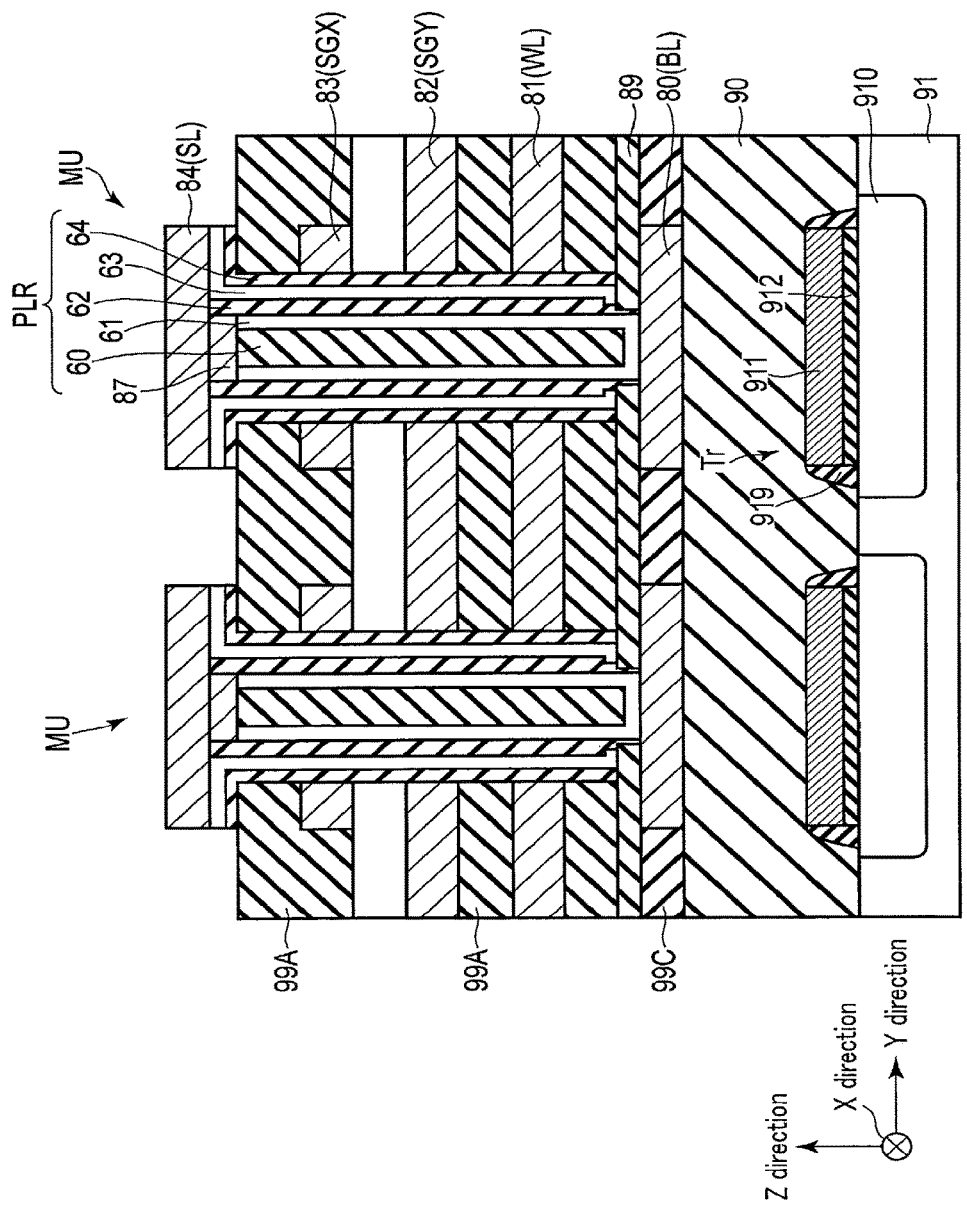

FIGS. 11 and 12 are sectional views illustrating the configuration example of the memory cell array of the semiconductor memory of the present embodiment. FIG. 11 shows an X-direction sectional structure of the memory cell array. FIG. 12 shows a Y-directional sectional structure of the memory cell array.

In FIGS. 10 to 12, only the memory units arranged in the 2×2 matrix, which are included in the memory units arranged in the m×n matrix, are illustrated, as in FIG. 9.

In the description given with reference to FIGS. 10 to 12, a description of contents substantially similar to those explained with reference to FIGS. 1 to 3 will be omitted.

As shown in FIGS. 10 to 12, in the memory cell array 10, a plurality of memory units MU are arranged in the X direction and the Y direction above the substrate (insulating layer) 90 on the semiconductor substrate 91.

A plurality of bit lines BL (BL<0> and BL<1>) are arranged on the substrate (insulating layer) 90. Each bit line BL extends in the X direction. Bit lines BL are arranged in the Y direction.

A plurality of memory units MU (two memory units in this example) arranged in the X direction are arranged on one bit line BL.

A plurality of source lines SL (SL<0> and SL<1>) are arranged above memory units MU.

Each source line SL is arranged on memory units MU arranged in the X direction.

For example, each source line SL is connected to the semiconductor layer (e.g., n$^+$-type polycrystalline Si layer) 61 of the pillar PLR by way of a source line contact 87.

The semiconductor layer 61 extends from source line SL to bit line BL.

The oxide semiconductor layer (e.g., InGaZnO layer) 63 extends in the Z direction from the upper surface of insulating layer 89 to source line SL. The oxide semiconductor layer 63 is isolated from bit line BL by insulating layer 89.

The oxide semiconductor layer 63 is in direct contact with source line SL. For example, the oxide semiconductor layer 63 is provided between the upper surface of insulating layer (interlayer insulation film) 99A and the bottom surface of source line SL. The bottom surface of source line SL is in contact with the oxide semiconductor layer 63 above insulating layer 99A. With this configuration, the contact area between source line SL and the oxide semiconductor layer 63 increases, as compared with the case where only the end portion of the oxide semiconductor layer 63 is in contact with source line SL. As a result, the memory device of the present embodiment is featured in that the electric resistance between source line SL and the oxide semiconductor layer 63 can be decreased, and electrons are allowed to move at high speed between source line SL and the charge storage layer CS in a write operation.

For example, the oxide semiconductor layer 63 is continuous between the memory units MU adjacent in the X direction. The oxide semiconductor layer 63 is disconnected between the memory units MU adjacent in the Y direction. The oxide semiconductor layer 63 may be continuous between the memory units MU adjacent in the Y direction. For example, insulating layer 64 is provided between the oxide semiconductor layer 63 and the upper surface of insulating layer 99A.

Conductive layers 81 serving as word lines WL (WL<0> and WL<1>) and conductive layers 82 serving as cut-off gate lines SGY (SGY<0> and SGY<1>) extend in the Y direction. Conductive layers 81 and conductive layers 82 intersect with a plurality of pillars PLR arranged in the Y direction.

Conductive layers 83 serving as cut-off gate lines SGX (SGX<0> and SGX<1>) extend in the X direction. Conductive layers 83 intersect with a plurality of pillars arranged in the X direction.

For example, a plurality of field-effect transistors (e.g., MOS transistors) Tr and metal interconnects INT may be arranged on the semiconductor substrate (semiconductor region) 91 provided under the memory cell array 10. Field-effect transistors Tr are used as circuits 11-17 of the semiconductor memory 1.

Each transistor Tr is arranged on a well region 910 in the semiconductor substrate 91.

The gate electrode 911 of transistor Tr is provided on the channel region between two source/drain regions 913 and 914, with a gate insulating film 912 interposed.

For example, each metal interconnect INT is electrically connected to transistor Tr by way of contact CP formed on the source/drain region 913, 914 of transistor Tr. Metal interconnect INT electrically connects a plurality of transistors Tr together and electrically connects transistors Tr and memory units MU together.

In FIGS. 11 and 12, each transistor Tr is a planar-type transistor. In place of this, a three-dimensional field-effect transistor, such as a FinFET or an embedded gate structure transistor, may be provided on the semiconductor substrate 91 at a position under the memory cell array 10.

<Operation Example>

An operation example of the semiconductor memory (e.g., random access memory) of the present embodiment will be described with reference to FIG. 13.

FIG. 13 is a timing chart illustrating an operation example of the random access memory of the present embodiment.

In the description below, the off voltage of a cut-off transistor has a voltage value that does not generate a channel in the oxide semiconductor layer. The on voltage of the cut-off transistor has a voltage value that generates a channel in the oxide semiconductor layer. The on voltage and off voltage of the cut-off transistor vary, depending upon the characteristics of the cut-off transistor.

In the description below, a memory unit and a memory cell that are selected as operation targets will be referred to as a selected unit and a selected cell, respectively. In contrast, a memory unit and a memory cell that are not selected will be referred to as a non-selected unit and a non-selected cell, respectively.

(a) Write Operation

In a write operation, the host device 9 transfers a write command, various control signals, addresses indicative of a data write target, and data to be written in a memory cell (hereinafter referred to as write data) to the random access memory 1.

Based on the command and control signals, the random access memory 1 carries out a data write operation for the selected unit (selected cell) indicated by the addresses.

Based on the command and control signals, the sequencer 17 controls the circuits of the random access memory 1. Based on the decoded address results obtained by the decoder 11, the row control circuit 12 and the column control circuit 13 activate and inactivate the interconnects of the memory cell array 10. Based on the write data supplied from the input/output circuit 15, the write/read circuit 14 determines voltages to be applied to interconnects (e.g., selected word lines) of the memory cell array 10. For example, the write driver is driven in the write/read circuit 14.

As a result, various voltages for the write operation are applied to the interconnects of the memory cell array 10.

As shown in FIG. 13, in the write operation, a voltage of 0V is applied to the non-selected word lines WLx, non-selected source lines SLx, non-selected bit lines BLx and non-selected cut-off gate lines SGXx and SGYx.

As a result, the non-selected memory units MU are inactivated. In each non-selected memory unit MU, at least one of the two cut-off transistors SX and SY is set in the OFF state. In the non-selected unit MU, therefore, the charge storage layer CS of the non-selected cell MC is electrically disconnected from source line SL by the cut-off transistors SX and SY in the OFF state.

For example, in non-selected unit MU connected to selected source line SLs and selected cut-off gate line SGXs, transistor SY connected to non-selected cut-off gate line SGYx is in the OFF state. Therefore, even if selected source line SLs is applied with a voltage and selected cut-off gate line SGXs is applied with an on voltage, the charge storage layer CS of a non-selected cell is electrically disconnected from selected source line SLs by cut-off transistor SY in the OFF state.

For example, in non-selected unit MU connected to selected word line WLS and selected cut-off gate line SGYs, transistor SX connected to non-selected cut-off gate line SGXx is in the OFF state. Therefore, even if selected cut-off gate line SGYs is applied with an on voltage, the charge storage layer CS of a non-selected cell is electrically disconnected from selected source line SLs by cut-off transistor SX in the OFF state.

As described above, in the random access memory of the present embodiment, reliable selection and non-selection with respect to the row direction and the column direction are ensured by the control of the cut-off gate lines SGX and SGY, and non-selected cells are prevented from performing an undesirable operation.

To suppress a parasitic channel in the semiconductor layer 61 of cut-off transistors SX and SY, negative voltage Vng may be applied to non-selected cut-off gate lines SGXx and SGYx. To prevent data from being mistakenly written in a non-selected cell, for example, non-selected word line WLx may be kept in an electrically floating state.

At time t1, on voltage Von is applied to selected cut-off gate lines SGXs and SGYs in a selected unit (selected cell). As a result, a channel is formed in the channel regions of cut-off transistors SX and SY in the selected unit. By the continuous oxide semiconductor layer 63, the charge storage layer CS of the memory cell MC is electrically connected to source line SL by way of the channel.

Source line voltage VSL having voltage value VX is applied to selected source line SLs. For example, voltage value VX is applied to selected bit line BLs.

In the write operation, it is preferable that the potential of selected bit line BLs be equal to the potential of selected source line SLs, so as to prevent a current from flowing between selected source line SLs and selected bit line BLs. It is also preferable that the potential of non-selected bit line BLx be equal to the potential of non-selected source line SLx.

Write voltage VWL having a predetermined voltage value is applied to selected word line WLs. For example, in a memory cell that stores 1-bit data, the voltage value of write voltage VWR is set at 0V in order to write "0" data. By application of voltage VWR of 0V, electrons discharge from the charge storage layer CS of the oxide semiconductor layer 63 of the memory cell MC and flow to source line SL.

Write voltage VWR is set at voltage value V1 sufficiently higher than 0V in order to write "1" data. By application of write voltage VWR having voltage value V1, electrons from selected source line SL flow through the channel in the oxide semiconductor layer 63 of on-state transistors SG and SY and are supplied (induced) to the charge storage layer CS of the oxide semiconductor layer 63 of the memory cell MC.

At time t2, which is after the application of write voltage VWR to selected word line WLs, a voltage of 0V (i.e., the off voltage Voff of transistors SX and SY) is applied to selected cut-off gate lines SGXs and SGYs. The channel in the oxide semiconductor layer 63 disappears from transistors SX and SY. Since transistors Sx and SY are in the OFF state, the charge storage layer CS is electrically disconnected from source line SL.

Because of this, the depletion state or accumulation state of the charge storage layer CS of selected cell MC is maintained.

As described above, the threshold voltage (on voltage) of a selected cell varies in accordance with the amount of electrons stored in the charge storage layer CS of the memory cell MC. The threshold voltage of the memory cell MC having a charge storage layer in which electrons are stored is higher than the threshold voltage of the memory cell having a charge storage layer in which electrons are not stored. For example, where electrons are stored in the charge storage layer CS, the memory cell MC serves as a normally-off transistor. Where electrons are not stored in the charge storage layer CS, the memory cell MC serves as a normally-on transistor.

In the manner described above, the write operation for a selected cell is completed in the random access memory of the present embodiment.

For example, the sequencer 17 notifies the host device 9 of the completion of the write operation.

(b) Data Retention Operation

In the random access memory of the present embodiment, the operation which the selected unit performs after the completion of the write operation is a data retention operation.

As shown in FIG. 13, in the data retention operation, the potential of selected cut-off gate lines SGXs and SGYs is set at 0V at time t2. Selected word line WLs is set in the electrically floating state. As a result, the diffusion (leakage) of electrons from the charge storage layer CS or the flow of electrons into the charge storage layer CS is prevented.

In this manner, the data retention condition of the memory cell MC is maintained.

(c) Read Operation

In a read operation, the host device 9 transfers a read command, various control signals, and addresses indicative of a data read target to the random access memory 1.

Based on the command and control signals, the random access memory 1 carries out a data read operation for the memory unit (memory cell) indicated by the addresses.

Based on the command and control signals, the sequencer 17 controls the circuits of the random access memory 1. Based on the decoded address results, the row control circuit 12 and the column control circuit 13 activate and inactivate the interconnects of the memory cell array 10. The write/read circuit 14 activates the sense amplifier, read driver, etc.

As a result, various voltages for the read operation are applied to the interconnects of the memory cell array 10.

As shown in FIG. 13, in the read operation, a voltage of 0V is applied to the non-selected word lines WLx, non-selected source lines SLx, non-selected bit line BLx and non-selected bit lines BLx.

For example, where the $n^+$-type semiconductor layer 61 becomes a parasitic channel in cut-off transistors SX and SY, a negative voltage Vng of a predetermined value may be applied to non-elected cut-off gate lines SGXx and SGYx of non-selected unit MU.

Because of the application of that voltage, those portions of the $n^+$-type semiconductor layer 61 opposed to the gate electrodes 82 and 83 of cut-off transistors SX and SY are depleted. As a result, a current is virtually prevented from flowing into the region between the bit line and the source line of non-selected unit MU. A voltage of 0V may be applied to non-selected cut-off gate lines SGXx and SGYx.

In non-selected unit MU, at least one of the two cut-off transistors SX and SY is set in the OFF state, as in the write operation. In the read operation, therefore, the non-selected unit and the non-selected cell are prevented from operating undesirably.

As described above, in the data read operation, the non-selected unit MU and the non-selected cell MC are inactivated.

At time t3, a voltage of 0V is applied to selected cut-off gate lines SGXs and SGYs in selected memory unit MU. As a result, cut-off transistors SX and SY of selected unit MU are set in the OFF state with respect to the channel region of the oxide semiconductor layer 63. In the read operation, therefore, the charge storage layer CS of the selected cell MC is electrically disconnected from selected source line SLs by the cut-off transistors SX and SY in the OFF state.

A bit line voltage VBL having a predetermined voltage value VY (e.g., a positive voltage value) is applied to selected bit line BLs. Selected source line SLs is set in the electrically floating state.

Word line voltage VRD having a positive voltage value V2 is applied to selected word line WLs. Voltage VRD is applied to the control gate electrode of selected cell MC. The voltage value V2 of read voltage VR may be 0V.

As a result, a current (read current) flows to the $n^+$-type semiconductor layer between selected source line SL and selected bit line BL in accordance with an operation performed by selected cell MC to which read voltage VRD is applied.

The magnitude of a read current for a given read voltage VDR varies in accordance with the amount of electrons stored in the charge storage layer CS of selected cell MC.

For example, the current value of a read current is smaller in the case where electrons are stored in the charge storage layer CS of selected cell MC than in the case where electrons are not stored in the charge storage layer CS of selected cell MC. The voltage value V2 of read voltage VRD is properly set such that the current value of a read current can have a proper margin in accordance with the amount of electrons in the charge storage layer.

The sense amplifier of the write/read circuit 14 senses a read current (or the potential of selected source line SLs) and compares it with a predetermined reference value. Alternatively, the sense amplifier senses whether or not the read current is present.

By this operation, it is discriminated whether the data in selected cell MC is "1" data or "0" data.

As described above, in the random access memory of the present embodiment, data stored in a selected cell can be read, based on the magnitude of the current flowing between selected source line SLs and selected bit line BLs (or the value of the resistance between the source line and the bit line).

At time t4, a voltage of 0V is applied to selected word line WLs, selected cut-off gate lines SGXs and SGYs, non-selected cut-off gate lines SGXx and SGYx, selected source line SLs and selected bit line BLs.

The sequencer 17 transfers the data read from the memory cell to the host device 9.

In the manner described above, the read operation for a selected cell is completed in the random access memory of the present embodiment.

(3) Modifications

Modifications of the semiconductor memory of the present embodiment will be described with reference to FIGS. 14 to 17.

<Modification 1>

An example of a modification of the semiconductor memory (e.g., random access memory) of the present embodiment will be described with reference to FIGS. 14 and 15.

FIG. 14 is a sectional view illustrating a configuration of the modification of the random access memory of the present embodiment.

As shown in FIG. 14, a source line contact 87x may be provided in the hole of the stacked structure including conductive layers 81-83 and insulating layers. For example, the source line contact 87 extends through the pillar PLR (inside the cylinder formed of insulating layer 62).

For example, the bottom of the source line contact 87x is located at a position (height) between the bottom of conductive layer (cut-off gate line) 82 and the top of conductive layer (word line) 81.

Conductive layers 82 and 83 are opposed to the side surface of the source line contact 87x. Conductive layer 81 is not opposed to the source line contact 87x.

An oxide semiconductor layer 63 sandwiched by two insulating layers 62 and 64 is provided between the source line contact 87x and conductive layers 82 and 83. A semiconductor layer 61x may be or not be present between conductive layer 82 and the source line contact 87x or between conductive layer 83 and the source line contact 87x.

The upper portion of the insulating layer 60x is located between the bottom portion of conductive layer 82 and the upper portion of conductive layer 81. The upper portion of the insulating layer 60x is in contact with the bottom portion of the source line contact 87x. The inside surface or upper portion of the semiconductor layer 61x is in contact with the bottom portion of the source line contact 87x.

The memory unit MU having the configuration shown in FIG. 14 can employ a normally-off transistor as a memory cell MC. In this case, either low-concentration n-type semiconductor layer (n⁻-type semiconductor layer) or a p-type semiconductor layer is used as the semiconductor layer 61x.

FIG. 15 is a graph illustrating the characteristics of the memory cell shown in FIG. 14.

In FIG. 15, the abscissa of the graph represents a gate voltage of the transistor (memory cell), while the ordinate of the graph represents a drain current of the transistor. In FIG. 15, solid line B1 indicates the V-I characteristics of the transistor when electrons are stored in the charge storage layer of the memory cell (accumulation state). Broken line B2 indicates the V-I characteristics of the transistor when electrons are depleted in the charge storage layer of the memory cell (depletion state).

As shown in FIG. 15, the normally-off memory cell MC is in the OFF state when a gate voltage of 0V is applied. The normally-off memory cell MC is turned on when a positive voltage higher than a voltage Vz2 is applied to the gate electrode.

As indicated by characteristic lines B1 and B2 in FIG. 15, even where the memory unit MU of the configuration of FIG. 14 employs a normally-off transistor as memory cell MC, the threshold voltages Vz1 and Vz2 of the memory cell MC and the drain currents thereof vary in accordance with whether charges are stored in the charge storage layer CS or not (accumulation state or depletion state).

Owing to this, the memory cell MC can retain data of 1 bit or more.

Therefore, the random access memory employing the memory unit of the present modification does not need a circuit for generating and controlling a negative voltage and the circuit configuration of the chip of the random access memory can be simplified.

As a result, the random access memory of the present embodiment can be manufactured at low cost.

<Modification 2>

An example of a modification of the semiconductor memory (e.g., random access memory) of the present embodiment will be described with reference to FIG. 16.

Figure 16:
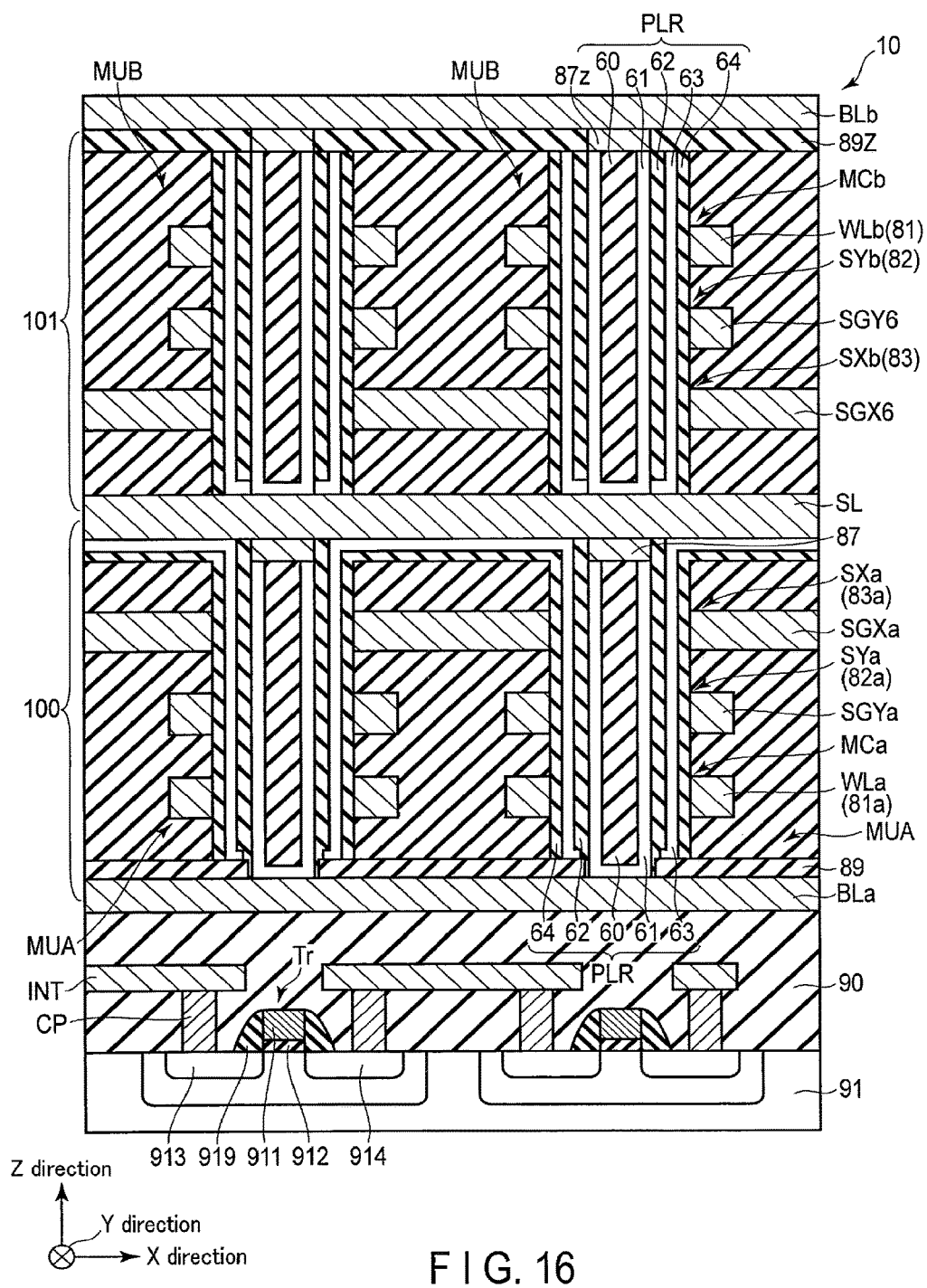
FIG. 16 is a sectional view illustrating a modification of a semiconductor memory of the first embodiment.

FIG. 16 is a sectional view illustrating a configuration of the modification of the random access memory of the present embodiment.

As shown in FIG. 16, a plurality of memory cell units MU may be stacked in the z direction in the memory cell array 10.

The memory cell array 10 shown in FIG. 16 includes a first array layer 100 and a second array layer 101.

In the first array layer 100, a plurality of memory units MUA are arranged in two dimensions. In the second array layer 101, a plurality of memory units MUB are arranged in two dimensions. The second array layer 101 is provided on the first array layer 100 in the Z direction.

Stacked two memory units MUA and MUB share one source line SL.

Memory cell MCb and transistors SXb and SYb of memory unit MUB are stacked on source line SL. Bit line BLb of memory unit MUB is provided above memory cell MCb and transistors SXb and SYb. Bit line BLa used for memory unit MUA is provided on insulating layer 90.

The stacking order in which elements MCb, SXb and SYb of memory unit MUB are stacked in the Z direction is opposite to that in which elements MCa, SXa and SYa of memory units MUA are stacked in the Z direction.

In memory unit MUB, two cut-off transistors SXb and SYb are provided below memory cell MC (on a substrate side). Cut-off transistor SYb is provided between memory cell MCb and cut-off transistor SXb.

In memory unit MUB, the oxide semiconductor layer 63 is electrically disconnected from bit line BLb by insulating layer 89Z.

In memory unit MUB, the upper portion of semiconductor layer 61 is electrically connected to bit line BLb by way of bit line contact 87Z. In memory unit MUB, the bottom portion of semiconductor layer 61 is in contact with source line SL.

Memory units MUA and elements MCa, SXa and SYa have substantially similar configurations to those described with reference to FIGS. 3, 12 and 13.

A plurality of memory layers may be stacked on each other such that the memory units stacked in the Z direction can share one bit line. In this case, a source line is provided in each memory layer.

In the random access memory of the present modification, a plurality of memory units are stacked in the Z direction. With this configuration, the memory cell array can have a high recording density, and the manufacturing cost per a bit (bit cost) can be reduced.

<Modification 3>

An example of a modification of the semiconductor memory (e.g., random access memory) of the present embodiment will be described with reference to FIG. 17.

In the semiconductor memory including a memory cell whose charge storage layer is made of an oxide semiconductor layer, the write voltage in a write operation can be controlled such that the memory cell MC can store data of 2 bits or more.

FIG. 17 illustrates the memory cell that retains data of 2 bits or more in the random access memory of the embodiment. In FIG. 17, the abscissa of the graph represents the amount of charges stored in the charge storage layer, while the ordinate of the graph represents frequency or probability of the memory cell to hold a certain amount of charges.

FIG. 17 illustrates an example in which the memory cell MC stores data of 2 bits.

Where the memory cell MC stores 2-bit data ("00", "01", "10" and "11"), four distributions (charge storage states) D1, D2, D3 and D4 corresponding to the amount of charges in the charge storage layer CS are associated with the 2-bit data.

By using four voltage values as write voltage VWR, 2-bit data is written in the memory cell MC. The memory cell MC can be set in one of the four states in accordance with the value of write voltage VWR.

The amount of charges induced in the charge storage layer CS varies in accordance with the value of write voltage VWR. Where write voltage VWR is 0V, the amount of electrons in the charge storage layer CS is set as distribution D1 corresponding to the state where "00" data is stored.

Where write voltage VWR has voltage value V1, the amount of electrons in the charge storage layer CS is set as distribution D4 corresponding to the state where "11" data is stored.

Where the voltage value of write voltage VWR is made smaller than voltage value V1 used for writing the "11" data, the amount of electrons accumulated in the charge storage layer CS can be set to be larger than the amount of electrons corresponding to distribution D1 and smaller than that corresponding to distribution D4.

For example, where the value of write voltage VWR is approximately one third of voltage value V1, the amount of electrons in the charge storage layer CS is set as distribution D2 corresponding to the state where "01" data is stored.

Where the value of write voltage VWR is approximately two thirds of voltage value V1, the amount of electrons in the charge storage layer CS is set as distribution D3 corresponding to the state where "10" data is stored.

In a read operation, the drain current of the memory cell MC varies when read voltage VR is applied. The 2-bit data stored in the memory cell MC can be identified by comparing the drain current with a reference value.

The amount of electrons supplied to the memory cell may be controlled by controlling the voltage value VX of selected source line SL in a write operation.

The data stored in memory cell MC may be identified by checking whether or not the memory cell MC is turned on in response to a plurality of voltage values applied to the control gate electrode in a read operation.

Where 3-bit data is written in the memory cell MC, eight voltage values are used as a write voltage.

As can be seen from this, the memory cell MC can store data of 2 bits or more by increasing the number of voltage values used as a write voltage.

(4) Conclusion

The semiconductor memory of the first embodiment is a memory (e.g., a random access memory) including a memory cell in which an oxide semiconductor layer is used for a charge storage layer.

A DRAM using a capacitor executes a refresh operation to maintain the reliability of data, after a read operation and when data is retained. The DRAM has the problem that the power consumption increases due to the refresh operation.

In a system using the DRAM, when the system is set in the sleep mode, extra operations, such as save operation of data from the DRAM to a nonvolatile memory or data loading again upon resume, are performed due to the fact that the DRAM is a volatile memory. As a result, the cost of the system may increase.

The semiconductor memory of the present embodiment stores data by accumulating charges in the oxide semiconductor layer having a comparatively wide band gap. Accordingly, the semiconductor memory of the present embodiment can prevent electrons from leaking from the memory cell, and the data retention characteristics of the memory cell can be improved. The semiconductor memory of the present embodiment can eliminate a refresh operation or can reduce frequency of the refresh operation. As a result, the semiconductor memory of the present embodiment can reduce the power consumption.

The semiconductor memory of the present embodiment can reduce the area of the control unit used for storing data. In addition, the semiconductor memory of the present embodiment enables a memory cell to store multi-valued data. As a result of these, the semiconductor memory of the present embodiment can reduce the bit cost.

Furthermore, since the semiconductor memory of the present embodiment enables a write/read operation to be performed without a high voltage, degradation of the films of the memory cell can be suppressed.

As described above, the semiconductor memory of the present embodiment is a semiconductor memory having high performance. In addition, the semiconductor memory of the present embodiment can reduce the memory cost.

[2] Second Embodiment

A semiconductor memory according to the second embodiment will be described with reference to FIGS. 18 to 37.

(1) First Example

A first example of the semiconductor memory (e.g., random access memory) of the second embodiment will be described with reference to FIGS. 18 to 23.

<Basic Example>

A basic example of the random access memory of the present embodiment will be described with reference to FIG. 18.

FIG. 18 is a sectional view illustrating a basic configuration of the random access memory of the present embodiment. In FIG. 18, illustration of the interlayer insulation film covering a memory unit is omitted.

As shown in FIG. 18, in the random access memory of the present embodiment, constituent elements MCz and Sz of memory unit MUZ are arranged on a substrate 90 in two dimensions.

A semiconductor layer 61Z is provided above the substrate (e.g., semiconductor substrate) 90. The semiconductor layer 61Z extends, for example, in the Y direction. The semiconductor layer 61Z is used as a channel region of memory cell. MCZ of the stacked gate structure.

An oxide semiconductor layer (e.g., InGaZnO layer) 63z is provided above the semiconductor layer 61Z, with insulating layer 62Z interposed. The oxide semiconductor layer 63Z extends, for example, in the Y direction.

The oxide semiconductor layer 63Z is electrically connected to the semiconductor layer 61Z by way of contact 85C.

A control gate electrode (conductive layer) 81Z of memory cell MCZ and a gate electrode (conductive layer) 82Z of cut-off gate transistor SZ are provided above the oxide semiconductor layer 63Z, with insulating layer 64Z interposed. For example, insulating layer 64Z functions as a block insulating film between the control gate electrode 81Z and charge storage layer CS. Insulating layer 64Z functions as a gate insulating film between the gate electrode 82Z and the oxide semiconductor layer 63Z.

The control gate electrode 81Z and the gate electrode 82Z are arranged side by side in the Y direction. The control gate electrode 81Z and the gate electrode 82Z extend, for example, in the X direction. The control gate electrode 81Z is used as a word line WL. The gate electrode 82Z is used as a cut-off gate line SZ. The X direction is a direction parallel to the substrate surface and perpendicular to the Y direction.

Conductive layer 80Z serving as a bit line BL is electrically connected to one end of the oxide semiconductor layer 63Z in the X direction, by way of bit line contact 85A. Bit line contact 85A is provided on the upper surface of the oxide semiconductor layer 63Z. The bit line BL is electrically connected to the semiconductor layer 61Z by way of the oxide semiconductor layer 63Z and contact 85C. Bit line contact 85A may extend through the oxide semiconductor layer 63Z up to the semiconductor layer 61Z. In this case, bit line contact 85A is electrically connected to the oxide semiconductor layer 63Z and the semiconductor layer 61Z.

Conductive layer 84Z serving as source line SL is electrically connected to one end of the semiconductor layer 61Z in the X direction, by way of source line contact 85B.

Source line contact 85B is provided on the upper surface of the semiconductor layer 61Z. Source line contact 85B is arranged at a position shifted from the position of bit line contact 85A in the X direction.

Source line contact 85B is isolated from the oxide semiconductor layer 63Z by an interlayer insulation film (not shown).

For example, a back gate electrode 65 is provided below the semiconductor layer 61Z, with insulating film 60Z interposed. The back gate electrode 65 extends, for example, in the X direction. Insulating film 60Z is used as a gate insulating film between the back gate electrode 65 and the semiconductor layer 61Z (insulating film 60Z may be referred to as a back gate insulating film as well).

Since the back gate electrode 65 is provided, the potential of a channel formed in the semiconductor layer 61Z in memory cell (sense transistor) MCZ can be controlled in a stable manner.

As a result, the accuracy with which data is read from memory cell MCZ can be improved.

The stabilization of the channel potential by the back gate electrode 65 is particularly advantageous to the case where memory cell MCZ retains data of 2 bits or more.

In memory unit MUZ shown in FIG. 18, the first terminal (source) of memory cell MCZ is connected to source line SL, and the second terminal (drain) of memory cell MCZ is connected to bit line BL.

One end of cut-off transistor SZ is continuously connected to the charge storage layer CS of memory cell MCZ, without an electrode or an interconnect being interposed. The other end of cut-off transistor SZ is connected to bit line BL. For example, the oxide semiconductor layer 63Z including the charge storage layer CS is used as a channel region of cut-off transistor SZ.

The material of the semiconductor layer 61Z may be the same as the semiconductor layer 61 of the first embodiment. The semiconductor layer 61Z is, for example, an n-type polysilicon layer.

The material of the oxide semiconductor layer 63Z may the same as the oxide semiconductor layer 63 of the first embodiment.

Where the semiconductor layer 61Z and the oxide semiconductor layer 63Z are formed of the same materials as layers 61 and 63 of the first embodiment, layers 61Z and 63Z may have thicknesses selected from substantially the same ranges as layers 61 and 63.

<Specific Example>

A specific example (which is more specific than the first example) of the random access memory of the present embodiment will be described with reference to FIGS. 19 to 22.

(a) Circuit Example

FIG. 19 is an equivalent circuit diagram of the memory cell array of the random access memory of the present embodiment. In FIG. 19, only 2×2 memory units, which are included in the m×n memory units of the memory cell array, are illustrated for the sake of simplicity.

As shown in FIG. 19, in a plurality of memory units MUZ arranged in the X direction, the control gate electrodes of a plurality of memory cells MCZ are connected to common word line WL (WL<0>, WL<1>).

In the memory units MUZ arranged in the X direction, the gate electrodes of a plurality of cut-off transistors SZ are connected to common cut-off gate line SGZ (SGZ<0>, SGZ<1>).

In the memory units MUZ arranged in the X direction, the back gate electrodes are connected to common back gate line BGL (BGL<0>, BGL<1>).

The memory units MUZ arranged in the Y direction are connected, at one end, to common bit line BL (BL<0>, BL<1>). The memory units MUZ arranged in the Y direction are connected, at the other end, to common source line SL (SL<0>, SL<1>). For example, the two memory units MUZ adjacent in the X direction are connected to the same source line SL.

The first terminal of memory cell MCZ is connected to source line SL. The second terminal of memory cell MCZ and the terminal of cut-off transistor SZ (i.e., one end of a channel region) are connected to bit line BL.

In each memory unit MUZ, the charge storage layer CS of memory cell MCZ is connected to bit line BL by way of the channel region of cut-off transistor SZ.

For example, the 2×2 memory units MUZ shown in FIG. 19, which constitute one unit, are arranged in the memory cell array 10 in two dimensions.

(b) Configuration Example

FIGS. 20 to 22 illustrate a configuration example of the memory cell array of the random access memory of the present embodiment.

FIG. 20 is a top view of the memory cell array of the random access memory of the present embodiment. FIG. 21 is a Y-direction sectional view of the memory cell array of the random access memory of the present embodiment. FIG. 22 is an X-direction sectional view of the memory cell array of the random access memory of the present embodiment.

In FIGS. 20 to 22, only 2×2 memory units, which are included in the m×n memory units of the memory cell array, are illustrated for the sake of simplicity.

As shown in FIGS. 20 to 22, the memory units MUZ adjacent in the Y direction share one semiconductor layer 61Z. The semiconductor layer 61Z continuous in the Y direction between two memory units MUZ. The semiconductor layers 61Z adjacent in the X direction are electrically isolated from each other.

Two oxide semiconductor layers 63Z are provided above one semiconductor layer 61Z. Insulating layer 62Z is provided between each oxide semiconductor layer 63Z and the semiconductor layer 61Z.

Source line contact 85B is provided in the region between two oxide semiconductor layers 63Z. Bit line contact 85A and source line contact 85B are arranged on the same line with respect to the Y direction.

Conductive layer 81Z serving as word line WL, conductive layer 82Z serving as cut-off gate line SGZ and conductive layer 65 serving as back gate line BGL extend in the X direction, so that these conductive layers can be shared by the memory units MUZ arranged in the X direction. Back gate line BGL intersects with a plurality of semiconductor layers 61Z, with insulating layer 50Z interposed in the Z direction.

Two word lines WL adjacent in the Y direction are laid out between two cut-off gate lines SGZ. Source line contact 85B is arranged between two word lines WL. Word line WL extending in the X direction intersects with a plurality of oxide semiconductor layers 63Z, with insulating layer 62Z interposed.

In the memory units MUZ adjacent in the Y direction (i.e., the memory units MUZ sharing semiconductor layer 61Z), the arrangement of memory cells MCZ and cut-off transistors SZ are symmetrically.

Conductive layer 80Z serving as bit line BL and conductive layer 84Z serving as source line SL extend mainly in the Y direction, so that these conductive layers can be shared by a plurality of memory units MUZ arranged in the Y direction.

Source line SL is arranged between two bit lines BL adjacent in the X direction.

For example, bit line BL and source line SL are at the same interconnect level. In the present embodiment, the "interconnect level" is intended to refer to the position (height) in the vertical direction (the Z direction) to the surface of the substrate.

Bit line BL and source line SL are arranged at positions that do not vertically overlap semiconductor layer 61Z or oxide semiconductor layer 63A.

Bit line BL and source line SL are led to positions that do not vertically overlap the oxide semiconductor layer 63Z by portions which extend in the X direction from the upper surfaces of contacts 85A and 85B on the semiconductor layer 61Z.

As in the semiconductor memory shown in FIG. 14, transistors that form circuits of the semiconductor memory 1 may be provided on a semiconductor substrate (not shown) below the substrate 90.

(c) Operation Example

An operation example of the random access memory of the present embodiment will be described with reference to FIG. 23.

Figure 23:
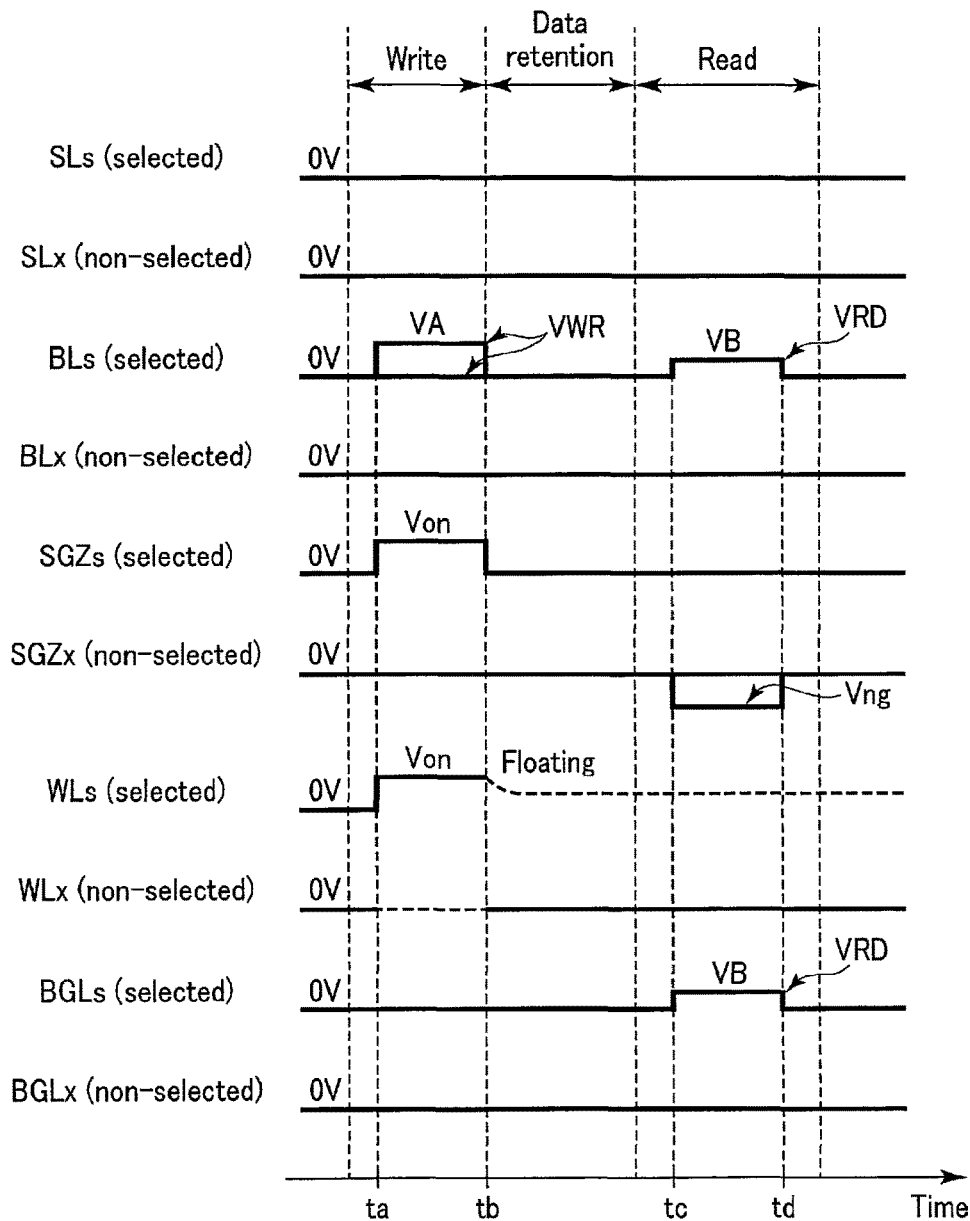
FIG. 23 is a waveform chart illustrating an operation example of a semiconductor memory of the second embodiment.

FIG. 23 is a timing chart showing an operation example of the random access memory of the present embodiment.

For example, the random access memory of the present embodiment enables a write operation to be performed simultaneously for a plurality of memory units arranged in the X direction (i.e., the memory cells commonly connected to a selected word line).

As shown in FIG. 23, on voltage Von of a transistor is applied to selected word line WLs and selected cut-off gate line SGZs. For example, a voltage of 0V is applied to back gate lines BGLs and BGLx.

For example, off voltage Voff of 0V is applied to non-selected cut-off gate line SGZx. As a result, cut-off transistor SZ of a non-selected unit is set in the OFF state. The charge storage layer CS of non-selected cell MCZ is electrically disconnected from bit lines BLs and BLz by cut-off transistor SZ in the OFF state. To prevent data from being mistakenly written in a non-selected cell, for example, non-selected word line WLx may be kept in an electrically floating state.

In the present embodiment, the potential of selected bit line BLs is controlled in accordance with data to be written. As a result, data can be individually written in each of the memory cells MCZ commonly connected to selected word line WLs.

Where electrons are accumulated in the charge storage layer CS, a voltage of 0V is applied to selected bit line BLs as write voltage VWR. Conversely, where electrons are discharged from the charge storage layer CS, a voltage having a voltage value VA larger than 0V (i.e., a positive voltage value) is applied to selected bit line BLs as write voltage VWR. Voltage value VA is approximately in the range of 1V to 5V.

Thereafter, off voltage Voff is applied to selected cut-off gate line SGZs, and cut-off transistor SZ is set in the OFF state.

Subsequently, selected word line WLs is set in the electrically floating state. Because of this, selected cell MCZ is set in the data retention state, and selected cell MCZ maintains an accumulation state or a depletion state of the charge storage layer CS.

In the present embodiment, one memory cell MC can store data of 2 bits or more by controlling the voltage value of the write voltage applied to selected bit line BL, as in the example described with reference to FIG. 17. For example, where four voltage values (e.g., 0V, (⅓)×VA, (⅔)×VA, and VA) are used as write voltage VWR applied to bit line BL, one memory cell MC can store data of 2 bits.

One memory cell MC can store data of 3 bits or more by further increasing the number of voltage values used as write voltage VWR.

In the read operation, a voltage of 0V is applied to selected cut-off gate line SGZs. As a result, cut-off transistor SZ of a selected unit MU is set in the OFF state.

Selected word line WLs is set in the electrically floating state. A voltage of 0V may be applied to selected word line WLs.

A voltage of 0V is applied to non-selected word line WLx, non-selected cut-off gate line SGZs, non-selected bit line BLx, non-selected back gate line BGLx and non-selected source line SLx. Negative voltage Vng may be applied to non-selected cut-off gate line SGZx.

Read voltage VRD having voltage value VB is applied to selected bit line BLs and selected back gate line BGLs. Selected source line SL is set to 0V.

The current flowing between selected bit line BLs and selected source line SL is sensed. As a result, the data in selected cell MCZ is identified.

The data in selected cell MCZ may be read by applying read voltage VR to selected word line WL. In this case, the voltage value of read voltage VRD applied to selected word line WLs is kept at a certain voltage value.

(2) Second Example

A second example of the semiconductor memory (e.g., random access memory) of the second embodiment will be described with reference to FIGS. 24 to 28.

In connection with this example, the description redundant with the first example mentioned above will be omitted.

<Basic Example>

A basic example of the second example of the random access memory of the present embodiment will be described with reference to FIG. 24.

As shown in FIG. 24, in the memory unit MU of this example, interconnect (injection line) IL is connected to the oxide semiconductor layer 63Z by way of contact 85D.

Contact 85D is provided on the upper surface of the oxide semiconductor layer 63Z.

Charge storage layer CS is connected to injection line IL by way of the channel region of cut-off transistor SZ.

In the memory unit MUZ shown in FIG. 24, bit line BL is not connected to the oxide semiconductor layer 63Z. An insulating layer (not shown) is provided between bit line BL and the oxide semiconductor layer 63Z. Bit line BL is isolated from the oxide semiconductor layer 63Z by the insulating layer.

In this example, electrons are supplied to charge storage layer CS and released therefrom using injection line IL, not bit line BL (or a source line).

Conductive layer 86Z serving as injection line IL is provided at an interconnect level higher than that of conductive layers 80z and 84z.

<Specific Example>

A specific example (which is more specific than the second example) of the random access memory of the present embodiment will be described with reference to FIGS. 25 to 28.

(a) Circuit Configuration

FIG. 25 is an equivalent circuit diagram of the memory cell array of the random access memory of the present embodiment.

As shown in FIG. 25, injection line IL (IL<0>, IL<1>) is connected in common to a plurality of memory units MUZ arranged in the Y direction.

A plurality of memory units MUZ arranged in the X direction are connected to different injection lines IL.

Bit line BL is connected to memory cells MCZ arranged in the Y direction. Bit line is not connected to cut-off transistor SZ.

(b) Configuration

FIGS. 26 to 28 illustrate a configuration example of the memory cell array of the random access memory of the present embodiment.

FIG. 26 is a top view of the memory cell array of the random access memory of the present embodiment. FIG. 27 is a Y-direction sectional view of the memory cell array of the random access memory of the present embodiment. FIG. 28 is an X-direction sectional view of the memory cell array of the random access memory of the present embodiment.

As shown in FIGS. 26 to 28, conductive layer 86Z serving as injection line IL extends in the Y direction. Conductive layer 86Z is provided at an interconnect level higher than that of conductive layers 80Z and 84Z.

Injection line IL is provided at a position vertically overlapping the semiconductor layer 61Z and oxide semiconductor layer 63Z in the Z direction. Injection line IL is laid out in the region between bit line BL and source line SL.

Injection line IL is connected to the oxide semiconductor layer 63Z by way of contact 85D. Contact 85D is provided on the upper surface of the oxide semiconductor layer 63Z.

Injection line IL is electrically connected to charge storage layer CS by way of the channel region of cut-off transistor SZ.

For example, contact 85D is adjacent to bit line contact 85A in the Y direction.

Bit line contact 85B is provided on the upper surface of the semiconductor layer 61Z. Bit line BL is connected to the semiconductor layer 61Z by way of bit line contact 85A.

Contact 85D, bit line contact 85A and source line contact 85B are arranged on the same line with respect to the Y direction.

(c) Operation

An operation example of the random access memory of the present embodiment will be described with reference to FIG. 29.

FIG. 29 is a timing chart showing an operation example of the random access memory of the present embodiment.

As shown in FIG. 29, in the write operation, the potential of selected bit line BLs is set at the same potential (e.g., 0V) as selected source line SLs.

The on voltage Von of memory cell MCZ and transistor SZ are applied to selected word line WLs and selected cut-off transistor SGZ.

To accumulate charges in the charge storage layer CS of a selected cell or release the charges therefrom, the potential of selected injection line ILs is controlled. Where electrons are accumulated in the charge storage layer CS, write voltage VWR of 0V is applied to selected injection line ILs. Where electrons are released from the charge storage layer CS, write voltage VWR having a voltage value VA (e.g., 1V to 5V) is applied to selected injection line ILs.

In the write operation, a voltage of 0V is applied to non-selected injection line ILx.

Thereafter, the off voltage (e.g., 0V) of transistor SZ is applied to selected cut-off gate line SGZs. Selected word line WLs is set in the electrically floating state. A voltage of 0V is applied to selected injection line ILs.

In the present embodiment, the retention of data and the reading of data are performed in a substantially similar manner to that of the example shown in FIG. 23. During the retention of data and the reading of data, the potentials of the injection lines ILs and ILx of a selected cell and a non-selected cell are set at 0V.

(3) Modifications

Modifications of the random access memory of the present embodiment will be described with reference to FIGS. 30 to 37.

<Modification 1>

FIG. 30 is a sectional view illustrating an example of a modification of the random access memory of the present embodiment.

As shown in FIG. 30, a back gate electrode (and a back gate line) need not be provided for memory unit MUZ.

In the semiconductor memory shown in FIG. 24 as well, the back gate electrode (and back gate line) may be omitted.

Where the back gate electrode is not formed, the random access memory shown in FIG. 30 can be manufactured at lower cost. In the random access memory shown in FIG. 30, the area for the memory cell can be reduced.

<Modification 2>

FIG. 31 is a sectional view illustrating an example of a modification of the random access memory of the present embodiment.

As shown in FIG. 31, the semiconductor region 92 of the substrate 90A (e.g., a semiconductor substrate) may be used as the channel region of a memory cell, without using the semiconductor layer on an insulating layer as the channel region of the memory cell.

The semiconductor region 92 is, for example, a p-type silicon region (well region).

Insulating layer (gate insulating film) 62X is provided between the semiconductor region 92 and the oxide semiconductor layer 63Z.

Source/drain regions 67A and 67B of memory cell (sense transistor) MC are provided in the semiconductor region 92. The source/drain regions 67A and 67B are, for example, high-concentration n-type silicon regions ($n^+$-type silicon regions).

One source/drain region 67A is connected to bit line BL by way of contacts 85A and 85C and the oxide semiconductor layer 63Z. Source/drain region 67A extends to the region below cut-off transistor SZ. Gate electrode 82Z is arranged above source/drain region 67A.

The other source/drain region 67B is connected to source line SL by way of contact 85B.

Control gate electrode 81Z is arranged above that semiconductor region (channel region) which is located between the two source/drain regions 67A and 67B.

For example, insulating layer 98 is provided in an element isolation region of the substrate 90A. The semiconductor region 92 is partitioned by insulating layer 98. With this configuration, memory units MUZ that do not share the semiconductor region 92 are electrically separated.

For example, by applying a voltage to the semiconductor region 92, a back bias (a substrate bias) can be applied to the channel region of memory cell MCZ.

The semiconductor memory in which injection line IL shown in FIG. 24 is connected to the oxide semiconductor layer 63Z may employ the semiconductor region 92 of the semiconductor substrate 90A.

Where, as in this example, memory unit MUZ is formed by employing the semiconductor region 92 of the semiconductor substrate 90A, the number of steps for forming the constituent elements of a memory unit can be decreased. As a result, the random access memory shown in FIG. 31 can be manufactured at low cost.

<Modification 3>

Figure 34:
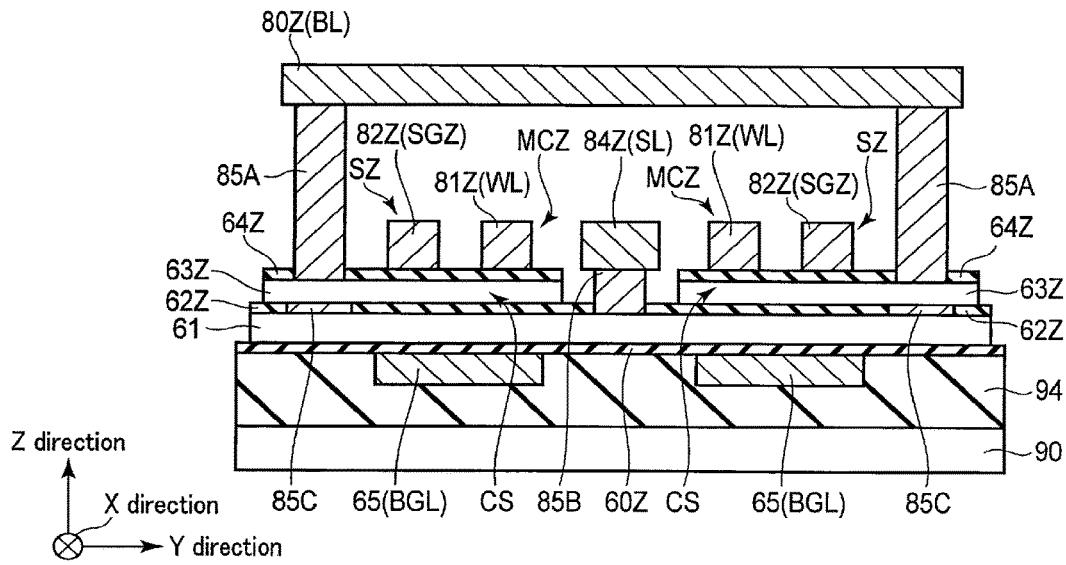
FIG. 34 is a sectional view illustrating a modification of a semiconductor memory of the second embodiment.

FIGS. 32 to 34 illustrate a modification of the random access memory of the present embodiment.

FIG. 32 is an equivalent circuit diagram illustrating an example of a modification of the random access memory of the present embodiment.

As shown in FIG. 32, in the random access memory of the present embodiment, an extending direction of source line SL may be in parallel to an extending direction (the X direction in this example) of word line WL (and cut-off gate line). In the X-Y plane, source lines SL extend in a direction intersecting with the direction (the Y direction in this example) in which bit lines BL extend.

FIG. 33 is a top view illustrating an example of a modification of the random access memory of the present embodiment.

FIG. 34 is a Y-direction sectional view of the random access memory shown in FIG. 33.

As shown in FIGS. 33 and 34, source line SL is connected in common to a plurality of memory units MUZ arranged in the X direction.

For example, source line SL is provided at an interconnect level lower than that of bit lines BL. Conductive layer 84A serving as source line SL is provided at the same interconnect level as conductive layer 81Z (the control gate electrode of a memory cell) serving as word line WL and conductive layer 82Z (the gate electrode of transistor SZ) serving as cut-off gate line SGZ. Source line SL may be provided at an interconnect level upper than that of bit line BL.

Bit lines BL are provided at a position vertically overlapping the semiconductor layer 61Z in the Z direction. Memory cell MCZ and cut-off transistor SZ are arranged below bit lines BL.

The random access memory shown in FIGS. 32 to 34 is advantageous in that in a read operation, a leak current leaking between the source and drain of a non-selected cell (cell transistor) is prevented from adversely affecting a read current supplied to a selected cell.

As a result, the random access memory of the present modification is improved in the data reading accuracy and the data reliability.

In the random access memory of the present embodiment, bit lines BL can be arranged above memory cell (sense transistor) MCZ and cut-off transistor SZ. As a result, the area of memory unit MUZ can be decreased in the X direction.

<Modification 4>

Figure 35:
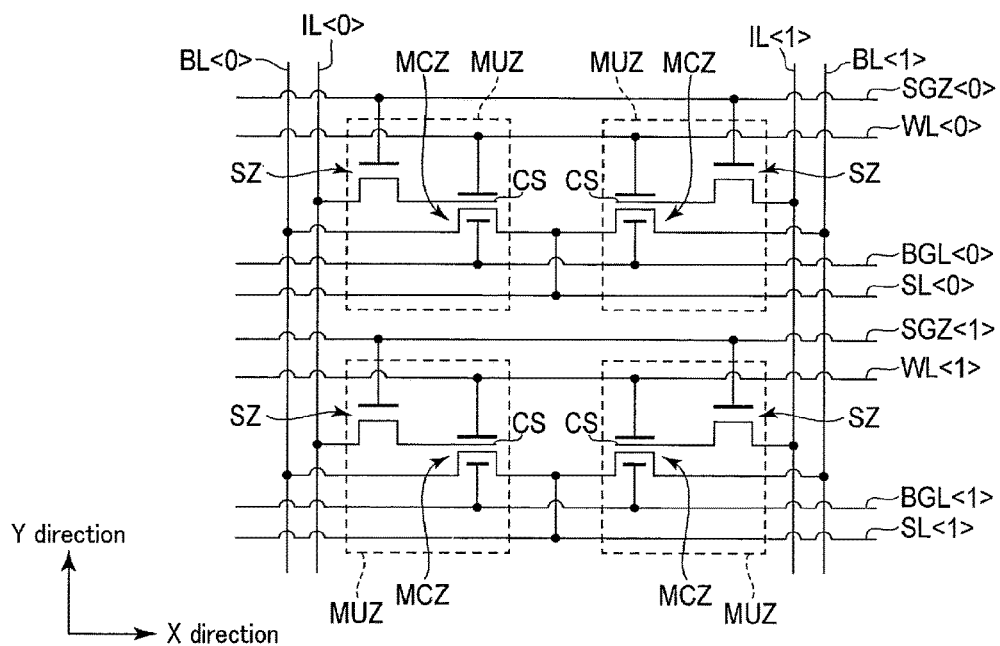
FIG. 35 is a circuit diagram illustrating a modification of a semiconductor memory of the second embodiment.

FIGS. 35 to 37 illustrate a modification of the random access memory of the present embodiment.

FIG. 35 is an equivalent circuit diagram illustrating an example of a modification of the random access memory of the present embodiment.

As shown in FIG. 35, in the random access memory of the present embodiment, even if an injection line is provided, the extending direction of a source line SL may extend in parallel to the extending direction of a word line WL (and cut-off gate lines) (in the X direction in this example).

In the X-Y plane, source lines SL extend in a direction intersecting with the direction in which injection lines IL extend.

FIG. 36 is a top view illustrating an example of a modification of the random access memory of the present embodiment.

FIG. 37 is a Y-direction sectional view of the random access memory shown in FIG. 36.

For example, source line SL is provided at an interconnect level lower than that of bit lines BL and injection line IL. Conductive layers 86Z serving as injection lines IL are provided at the same interconnect level as conductive layers 80Z serving as bit lines BL.

Injection lines IL are provided at a position vertically overlapping the semiconductor layer 63Z in the Z direction. Bit lines BL are provided at a position not vertically overlapping the semiconductor layer 63Z in the Z direction.

Like the random access memory shown in FIGS. 32 to 34, the random access memory of the present example can suppress the adverse effects which a leak current leaking between the source and drain of a non-selected cell may have. Accordingly, the data reading accuracy and the data reliability can be improved.

(4) Conclusion

In the semiconductor memory of the second embodiment, memory cell MCZ and cut-off transistor SZ of memory unit MUZ are arranged on the substrate 90 in two dimensions.

The semiconductor memory of the present embodiment can produce advantages similar to those of the first embodiment.

Where memory cells MC and cut-off transistors SZ of memory unit MUZ are arranged on the substrate in two dimensions, as in this embodiment, the semiconductor memory can be formed in a comparatively simple process.

As a result of this, the semiconductor memory of the present embodiment can reduce the bit cost.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory comprising:
a first interconnect;
a second interconnect;
a member extending in a first direction and including an oxide semiconductor layer, the first direction being parallel to a direction from the first interconnect to the second interconnect, a first end of the oxide semiconductor layer in the first direction electrically connected to the second interconnect, and a second end of the oxide semiconductor layer in the first direction electrically disconnected from the first interconnect, the oxide semiconductor layer including a first portion, second portion and third portion arranged in order from the second end to the first end;

first, second and third conductive layers disposed along the first direction, the first conductive layer facing the first portion, the second conductive layer facing the second portion, and the third conductive layer facing the third portion;

a memory cell provided in a first region including the first portion, the memory cell including a charge storage layer in the first portion;

a first transistor provided in a second region including the second portion; and a second transistor provided in a third region including the third portion.

2. The semiconductor memory according to claim 1, wherein
the oxide semiconductor layer extends from the first portion to the second interconnect,
the first transistor includes a first channel region in the second portion, and
the second transistor includes a second channel region in third portion.

3. The semiconductor memory according to claim 1, wherein
the member includes a semiconductor layer extending in the first direction,
the memory cell includes a third channel region in the semiconductor layer,
a third end of the semiconductor layer in the first direction is electrically connected to the second interconnect; and
a fourth end of the semiconductor layer in the first direction is electrically connected to the first interconnect.

4. The semiconductor memory according to claim 1, further comprising:
an insulating layer disposed between the first interconnect and the second interconnect and covering the first, second and third conductive layers,
wherein the oxide semiconductor layer is provided between the second interconnect and the insulating layer.

5. The semiconductor memory according to claim 1, further comprising:
a contact electrically connected to the second interconnect; and
a semiconductor layer provided in the member.

6. The semiconductor memory according to claim 5, wherein
the second conductive layer is located between the first conductive layer and the third conductive layer,
the contact is located inside the member and extends from the second interconnect to a region between the first conductive layer and the second conductive layer in the first direction, and
the semiconductor layer extends from the first interconnect to the contact.

7. The semiconductor memory according to claim 1, wherein
a threshold voltage of the memory cell varies in accordance with an amount of charges in the charge storage layer,
the memory cell retains first data where the threshold voltage of the memory cell is a first value, and
the memory cell retains second data different from the first data where the threshold voltage of the memory cell is a second value different from the first value.

8. The semiconductor memory device according to claim 7, wherein
the charges are supplied from the second interconnect to the oxide semiconductor layer.

9. The semiconductor memory device according to claim 1, further comprising:
another insulating layer provided between the first conductive layer and the first portion, between the second conductive layer and the second portion, and between the third conductive layer and the third portion.

* * * * *